(12) United States Patent
Satsukawa

(10) Patent No.: US 7,603,600 B2
(45) Date of Patent: Oct. 13, 2009

(54) TIMING FAILURE REMEDYING APPARATUS FOR AN INTEGRATED CIRCUIT, TIMING FAILURE DIAGNOSING APPARATUS FOR AN INTEGRATED CIRCUIT, TIMING FAILURE DIAGNOSING METHOD FOR AN INTEGRATED CIRCUIT, INTEGRATED CIRCUIT, COMPUTER READABLE RECORDING MEDIUM RECORDED THEREON A TIMING FAILURE DIAGNOSING PROGRAM FOR AN INTEGRATED CIRCUIT, AND COMPUTER READABLE RECORDING MEDIUM RECORDED THEREON A TIMING FAILURE REMEDYING PROGRAM FOR AN INTEGRATED CIRCUIT

(75) Inventor: Yoshihiko Satsukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 231 days.

(21) Appl. No.: 11/843,032

(22) Filed: Aug. 22, 2007

(65) Prior Publication Data

US 2008/0104467 A1 May 1, 2008

(30) Foreign Application Priority Data

Oct. 31, 2006 (JP) ............................ 2006-295943

(51) Int. Cl.
*G01R 31/28* (2006.01)

(52) U.S. Cl. ................ 714/729; 714/718; 714/733; 714/738; 714/744

(58) Field of Classification Search ................ 702/185; 714/726, 731, 718, 733, 738, 744, 729
See application file for complete search history.

(56) References Cited

U.S. PATENT DOCUMENTS

| | | | | |
|---|---|---|---|---|
| 6,671,842 | B1 * | 12/2003 | Phan et al. .................. | 714/733 |
| 6,964,002 | B2 * | 11/2005 | Lurkins ...................... | 714/731 |
| 7,290,186 | B1 * | 10/2007 | Zorian et al. ................ | 714/718 |
| 7,539,598 | B2 * | 5/2009 | Jang et al. ................... | 702/185 |
| 2007/0186132 | A1 * | 8/2007 | Dingemanse ............... | 714/726 |
| 2008/0010573 | A1 * | 1/2008 | Sul ............................ | 714/731 |

FOREIGN PATENT DOCUMENTS

| JP | 2001-43261 | 2/2001 |
|---|---|---|
| JP | 2003-4807 | 1/2003 |

* cited by examiner

*Primary Examiner*—David Ton
(74) *Attorney, Agent, or Firm*—Staas & Halsey LLP

(57) ABSTRACT

A timing failure remedying apparatus for an integrated circuit has a comparator which compares a value captured in a taking-out scan chain for reference through an operation of a processing core for reference according to a first clock signal with a value captured in a taking-out scan chain to be tested through an operation of a processing core to be tested according to a second clock signal, a diagnosing unit which determines a timing failure in the logic circuit to be tested on the basis of a result of comparison by the comparator, and an adjuster which adjusts at least either a second cycle or a delay amount of the second clock signal. It is possible to examine a position of the timing failure or the number of the timing failures in the integrated circuit diagnosed as that its logic is normal but the timing failure occurs therein.

22 Claims, 18 Drawing Sheets

TIMING FAILURE REMEDYING APPARATUS FOR AN INTEGRATED CIRCUIT, TIMING FAILURE DIAGNOSING APPARATUS FOR AN INTEGRATED CIRCUIT, TIMING FAILURE DIAGNOSING METHOD FOR AN INTEGRATED CIRCUIT, INTEGRATED CIRCUIT, COMPUTER READABLE RECORDING MEDIUM RECORDED THEREON A TIMING FAILURE DIAGNOSING PROGRAM FOR AN INTEGRATED CIRCUIT, AND COMPUTER READABLE RECORDING MEDIUM RECORDED THEREON A TIMING FAILURE REMEDYING PROGRAM FOR AN INTEGRATED CIRCUIT

BACKGROUND OF THE INVENTION

1) Field of the Invention

The present invention relates to a technique for diagnosing/remedying a timing failure in an integrated circuit [for example, an LSI (Large Scale Integration)]. More specifically, the present invention relates to a technique for diagnosing/remedying a timing failure such as over-delay or the like occurring in an LSI having a plurality of same logic circuits [CPU (Central Processing Unit) cores].

2) Description of the Related Art

In order to determine whether an integrated circuit (for example, an LSI) is good or bad, as shown in FIG. 17, good/bad determination of an LSI 104 is carried out in the following manner, in general. In a scan chain 101 formed by connecting a plurality of flip-flops (denoted as "FF" in the drawing) 100-1 through 100-15 (hereinafter denoted simply by a reference character "100" when these flip-flops 100-1 through 100-15 are not specifically discriminated from one another) in series, setting values for the respective flip-flops are shifted in to be set in all the flip-flops, a clock is applied through a clock signal input circuit 102 and a clock delay adjusting circuit 103 thereto, and the values captured in the respective flip-flops are read out from the scan chain. It is then determined whether each of the values read out coincides with its expectation value.

Namely, after initial values are shifted from an SI (Scan In) input terminal 105 and set in respective flip-flops 100, a clock is applied, data passed through logic circuits (denoted as "Logic" in the drawing) 106-1 and 106-2 (hereinafter denoted simply by a reference character "106" when these logic circuits 106-1 and 106-2 are not specifically discriminated from one another) is thereby captured in the flip-flops 100-6 through 100-10, and 100-11 through 100-15 in the following stages.

For example, like the flip-flops 100-6 through 100-10 in the middle column (middle portion) in FIG. 17, the flip-flops 100 generally fulfill both functions of giving inputs to the logic circuit 106 and holding output values from the logic circuit 106 after a clock is applied.

The output values captured in the flip-flops 100 are shifted through the scan chain 101, read out from an SO (Scan Out) terminal 107 to the outside of the LSI 104, and compared with their expected values.

During the scan to read out the output values from the SO output terminal 107, data is simultaneously inputted to the SI terminal 105, whereby setting values for the next test can be given to the flip-flops 100.

In such known method, it is possible to detect which flip-flop 100 has a value differing from its expected value, that is, possible to specify a faulty flip-flop 100. Incidentally, over-delay can be detected by applying a plurality of clocks, and determining whether a time from update of a sending flip-flop 100 to update of a receiving flip-flop is within a predetermine period of time set beforehand.

In the case shown in FIG. 17, since it is possible to specify a faulty position (flip-flop 100) the failure may be solved by changing the setting value of the clock delay adjusting circuit 103 if the failure is a timing failure.

For this purpose, there is provided a mechanism in which the clock delay adjusting circuit 103 is provided to each clock distributing system, a clock delay setting value is set through a scan chain (clock delay setting information retaining unit) 108, and the delay is determined according to this signal.

When a timing failure is detected, the delay of a clock that drives a flip-flop 100 developing the timing failure may be adjusted.

There is another technique (refer to Patent Document 1 below, for example). According to this technique, the clock delay setting value retained in the scan chain 108 is changed to adjust the clock delay so that occurrence of the timing failure is decreased in a trial-and-error fashion, and a clock delay setting value at which the timing failure does not occur is finally searched, or a clock delay setting value at which the best performance is obtained is searched even though a relation between a position at which the timing failure occurs and the clock path to be adjusted is not specified.

In the recent LSI, the gate scale is very large, which causes an increase in number of flip-flips on the LSI. This leads to a longer scan shift time, which causes an increase in test time. This further causes problems with the test cost and TAT (Turn Around Time).

As a measure against these problems, there is logic BIST (Built In Self Test). In the logic BIST, flip-flops are set with known logic information such as outputs of a pseudo random circuit. Since the set values are generated inside the LSI, it becomes possible to increase the number of scan chains beyond the limitation of the number of LSI pins or a tester, thereby increasing the number of parallel scan chains to decrease each scan chain length, which allows a shorter test time.

If values captured in the flip-flops are all read out from the scan chains after a clock is applied, it means that the scan-in and the scan-out are performed concurrently. Thus, the effect of parallelization of the scan chains cannot be obtained. For this, the logic BIST outputs compressed data as its outputs.

In concrete, values of a number of paralleled scan chains are compressed into signatures by an MISR (Multiple Input Signature Register), and good or bad of the LSI is determined by whether the signatures agree or not.

In an LSI 109 shown in FIG. 18, for example, pseudo random numbers generated by an LFSR (Linear Feedback Shift Register) 110 are set as initial values in flip-flops 100 by scan shift.

Next, data passing through logic circuits 106 are captured into flip-flops 100-6 through 100-10 and flip-flops 100-11 through 100-15 when a clock is applied. The values in the flip-flops 100 are shifted through the scan chains, and signature values are calculated by an MISR 111. The signature values are retained in flip-flops (not shown) in the MISR 111, read out by a scan path 112 for read out only to the outside of the LSI 109, and compared with their expectation values.

The MISR 111 so calculates a signature value that the signature value differs from its expectation value at a considerably high rate (that is, a failure can be detected) when the output value of the logic circuit 106 is not correct, whereby the logic BIST can detect whether the LSI 109 operates normally or not.

In the logic BIST, it is possible to detect an over-delay failure by applying a plurality of clocks.

There is a technique that enables the timing test to be conducted at an actual operation speed of the LSI when the timing test is conducted on the LSI (for example, refer to Patent Document 2 below).

In the known logic BIST described above with reference to FIG. 18, a signature value compressed by the MISR 111 is compared with its expectation value. This provides only information about whether the LSI 109 operates normally or not, not providing information about a position at which the failure occurs, or the number of the failures. Namely, it is generally impossible to recon backward a flip-flop 100 (that is, a faulty flip-flop) that has retained the incorrect value on the basis of the signature value calculated by the MISR 111.

However, even in the known logic BIST, the timing failure may be solved by changing the clock delay value retained in the scan chain 108 or the cycle of the clock signal. In such case, the tested LSI 109 is diagnosed as that its logic circuit 106 is normal but a timing failure occurs therein.

Meanwhile, the logic BIST can detect a racing chip even when the chip has a logic failure due to open or short of the wiring or a timing failure.

In the LSI 109 diagnosed as that it has a normal logic but a timing failure occurs therein, the clock delay or the like has to be adjusted to solve the timing failure. However, the known logic BIST cannot detect a position of the timing failure, thus cannot guess at all which clock delay value needs to be changed to remedy the failure.

Since the known logic BIST cannot detect the number of timing failures, it is impossible to decrease the number of the failures in a trial-and-error fashion by changing the clock delay value or the like.

Further, when a position at which the failure occurs is unknown, it is impossible to conduct failure analysis, as well as the clock delay adjustment.

Accordingly, in the logic BIST in an LSI, particularly, an LSI having a plurality of processor cores (CPU cores) and a number of parallel scan chains, it is desirable to discriminate a position of the timing failure, the number of failures and so forth.

[Patent Document 1] Japanese Patent Application Laid-Open No. 2001-43261

[Patent Document 2] Japanese Patent Application Laid-Open No. 2003-4807

SUMMARY OF THE INVENTION

In the light of the above problems, an object of the present invention is to be able to diagnose a position of a failure or the number of failures in an integrated circuit having a plurality of processing cores, which is pronounced a diagnosis as that logic of the integrated circuit is normal but a timing failure occurs therein, and to be able to remedy the timing failure on the basis of the position of the timing failure and the number of the timing failures.

To attain the above object, the present invention provides a timing failure remedying apparatus for an integrated circuit having a plurality of logic circuits of the same logic, comprising a pattern generator for generating a test pattern to be inputted to each of the plural logic circuits, a plurality of inputting scan chains for inputting the test pattern generated by the pattern generator to the plural logic circuits, respectively, a plurality of taking-out scan chains for taking out values resulting from the test pattern from the plural logic circuits, respectively, a first clock signal applying unit for applying a first clock signal in a first cycle to a processing core for reference having one of the plural logic circuits functioning for reference, one of the plural inputting scan chains (hereinafter referred to as an inputting scan chain for reference) corresponding to the logic circuit for reference and one of the plural taking-out scan chains (hereinafter referred to as a taking-out scan chain for reference) corresponding to the logic circuit for reference, a second clock signal applying unit for applying a second clock signal in a second cycle differing from the first cycle to a processing core to be tested having another one of the plural logic circuits functioning to be tested, another one of the plural inputting scan chains (hereinafter referred to as an inputting scan chain to be tested) corresponding to the logic circuit to be tested and another one of the plural taking-out scan chains (hereinafter referred to as a taking-out scan chain to be tested) corresponding to the logic circuit to be tested, a first comparator for comparing a value captured in the taking-out scan chain for reference from the logic circuit for reference through an operation of the processing care for reference according to the first clock signal applied by the first clock signal applying unit with a value captured in the taking-out scan chain to be tested from the logic circuit to be tested through an operation of the processing core to be tested according to the second clock signal applied by the second clock signal applying unit, a diagnosing unit for diagnosing a timing failure in the logic circuit to be tested on the basis of a result of comparison made by the first comparator, and an adjuster for, when the diagnosing unit pronounces a diagnosis that a timing failure occurs, adjusting at least either the second cycle or a delay amount of the second clock signal to be applied to the processing core to be tested by the second clock signal applying unit to remedy the timing failure.

It is preferable that the timing failure remedying apparatus for an integrated circuit further comprises a compressing/storing unit for compressing values taking out from the logic circuits and outputted from the plural taking-out scan chains as signatures, and storing the same.

It is preferable that the timing failure remedying apparatus for an integrated circuit further comprises a counter for counting results of comparison made by the first comparator, wherein the diagnosing unit diagnoses the number of timing failures occurring in the logic circuit to be tested on the basis of a value of the counter.

It is preferable that the timing failure remedying apparatus for an integrated circuit still further comprising a first retaining unit for retaining a result of comparison made by the first comparator, wherein the diagnosing unit specifies a faulty scan chain in which the timing failure occurs on the basis of the result of comparison retained in the first retaining unit.

It is preferable that the diagnosing unit can read a value held in the final stage of the taking-out scan chain to be tested, and the diagnosing unit reads the value retained in the final stage of the taking-out scan chain to be tested when pronounces a diagnosis that a timing failure occurs in the logic circuit to be tested, and specifies a failure position at which the timing failure occurs in the taking-out scan chain to be tested on the basis of the read value.

The present invention further provides a timing failure remedying apparatus for an integrated circuit having a plurality of logic circuits of same logic, comprising a pattern generator for generating a test pattern to be inputted to each of the plural logic circuits, a plurality of inputting scan chains for inputting the test pattern generated by the pattern generator to the plural logic circuits, respectively, a plurality of taking-out scan chains for taking out values resulting from the test pattern from the plural logic circuits, respectively, a first clock signal applying unit for applying a first clock signal in a first cycle to a processing core for reference having one of the plural logic circuits functioning for reference, one of the plural inputting scan chains corresponding to the logic circuit for reference and one of the plural taking-out scan chains (hereinafter referred to as a taking-out scan chain for reference) corresponding to the logic circuit for reference, a second clock signal applying unit for applying a second clock signal in a second cycle differing from the first cycle to a processing core to be tested having another one of the plural logic circuits functioning to be tested, another one of the plural inputting scan chains corresponding to the logic circuit to be tested and another one of the plural taking-out scan chains (hereinafter referred to as a taking-out scan chain to be tested) corresponding to the logic circuit to be tested, a comparator for comparing a value captured in the taking-out scan chain for reference from the logic circuit for reference through an operation of the processing core for reference according to the first clock signal applied by the first clock signal applying unit with a value captured in the taking-out scan chain to be tested from the logic circuit to be tested through an operation of the processing core to be tested according to the second clock signal applied by the second clock signal applying unit, and a diagnosing unit for diagnosing a timing failure in the logic circuit to be tested on the basis of a result of comparison made by the comparator.

The present invention still further provides a timing failure diagnosing method for an integrated circuit having a plurality of processing cores, each of which has a logic circuit, an inputting scan chain for inputting a test pattern to the logic circuit, and a taking-out scan chain for taking out values resulting from the test pattern from the logic circuit, the logic circuits of the plural processing cores being of the same logic, comprising the steps of inputting the same test pattern to the logic circuits of the plural processing cores through the inputting scan chains, applying a first clock signal in a first cycle to one of the plural processing cores functioning for reference, applying a second clock signal in a second cycle differing from the first cycle to another one of the plural processing cores functioning to be tested, comparing a value captured in a corresponding one of the taking-out scan chains from the logic circuit of the processing core for reference through an operation of the processing core for reference according to the first clock signal with a value captured in a corresponding one of the taking-out scan chains from the logic circuit of the processing core to be tested through an operation of the processing core to be tested according to the second clock signal, and diagnosing a timing failure in the logic circuit of the processing core to be tested on the basis of a result of the comparison.

The present invention still further provides an integrated circuit comprising a plurality of logic circuits of the same logic, a pattern generator for generating a test pattern to be inputted to each of the plural logic circuits, a plurality of inputting scan chains for inputting the test pattern generated by the pattern generator to the plural logic circuits respectively, a plurality of taking-out scan chains for taking out values resulting from the test pattern from the plural logic circuits, respectively, a first clock signal applying unit for applying a first clock signal in a first cycle to a processing core for reference having one of the plural logic circuits functioning for reference, one of the plural inputting scan chains corresponding to the logic circuit for reference and one of the plural taking-out scan chains (hereinafter referred to as a taking-out scan chain for reference) corresponding to the logic circuit for reference, a second clock signal applying unit for applying a second clock signal in a second cycle differing from the first cycle to a processing core to be tested having another one of the plural logic circuits functioning to be tested, another one of the plural inputting scan chains corresponding to the logic circuit to be tested and another one of the plural taking-out scan chains (hereinafter referred to as a taking-out scan chain to be tested) corresponding to the logic circuit to be tested, and a comparator for comparing a value captured in the taking-out scan chain for reference from said logic circuit for reference through an operation of the processing core for reference according to the first clock signal applied by the first clock signal applying unit with a value captured in the taking-out scan chain to be tested from the logic circuit to be tested through an operation of the processing core to be tested according to the second clock signal applied by the second clock signal applying unit.

According to this invention, the first clock signal applying unit applies a first clock signal in a first cycle to a processing core for reference, the second clock signal applying unit applies a second clock signal in a second cycle differing from the first cycle to a processing core to be tested, the comparator compares a value captured in a taking-out scan chain for reference through an operation of the processing core for reference according to the first clock signal with a value capture in a taking-out scan chain to be tested through an operation of the processing core to be tested, and the diagnosing unit diagnosis a timing failure in the logic circuit to be tested. Therefore, it is possible to diagnose, with certainty, a timing failure in an integrated circuit, which is pronounced as that the logic thereof is normal but a timing failure occurs therein.

Namely, since the timing failure is diagnosed, with one of the plural processing cores being used for reference whereas another one of them being used as a testee, the diagnosing unit can diagnose the timing failure after specifying the taking-out scan chain to be tested. As a result, the diagnosing unit can specify a taking-out scan chain to be tested or a logic circuit to be tested as a failure position, together with presence/absence of the timing failure.

Further, when the diagnosing unit pronounces a timing failure, the adjuster adjusts at least either the second cycle or a delay amount of the second clock signal in order to remedy the timing failure in the logic circuit to be tested that is diagnosed by the diagnosing unit as that the timing failure occurs therein. Thus, it is possible to remedy the timing failure, with certainty and efficiently.

The timing failure remedying apparatus for an integrated circuit according to this invention has a compressing/storing unit which compresses values outputted from the plural taking-out scan chains and taken out from the logic circuits into signatures, and stores them. Therefore, it is possible to overcome a disadvantage of the known logic BIST that a failure position (a faulty scan chain or faulty logic circuit) cannot be specified, thereby remedying the timing failure efficiently.

The timing failure remedying apparatus for an integrated circuit according to this invention has a counter which counts results of comparison made by the comparator, where the diagnosing unit detects the number of timing failures in the logic circuit to be tested on the basis of the value of the counter. Therefore, the diagnosing unit can examine a degree of the timing failure in the logic circuit to be tested.

Further, the timing failure remedying apparatus for an integrated circuit according to this invention has a first retaining unit which retains a result of comparison made by the comparator, wherein the diagnosing unit specifies, on the basis of the result of comparison retained in the first retaining unit, a faulty scan chain in which the timing failure occurs. Therefore, the diagnosing unit can specify, with more certainty, a failure position at which the timing failure occurs.

The diagnosing unit can read out a value retained in the final stage of the taking-out scan chain to be tested. When pronouncing that a timing failure occurs in the logic circuit to be tested, the diagnosing unit reads out a value retained in the final stage of the taking-out scan chain to be tested, and specifies a failure position at which the timing failure occurs in the taking-out scan chain to be tested on the basis of the read value. Accordingly, the diagnosing unit can specify a faulty flip-flop, with certainty.

BRIEF DESCRIPTION OF THE DRAWINGS

FIG. 6(a) is a diagram showing a first clock signal applied by the first clock signal applying unit, and FIG. 6(b) is a diagram showing a second clock signal applied by the second clock signal applying unit;

FIG. 16(a) is a diagram showing a clock signal generated by a PLL inside the integrated circuit, FIG. 16(b) is a diagram showing a first clock signal applied by the first clock signal applying unit, and FIG. 16(c) is a diagram showing a second clock signal applied by the second clock signal applying unit;

DESCRIPTION OF THE PREFERRED EMBODIMENTS

Preferred embodiments of the present invention are described in more detail below referring to the accompanying drawings.

[1] First Embodiment of the Invention

Figure 1:
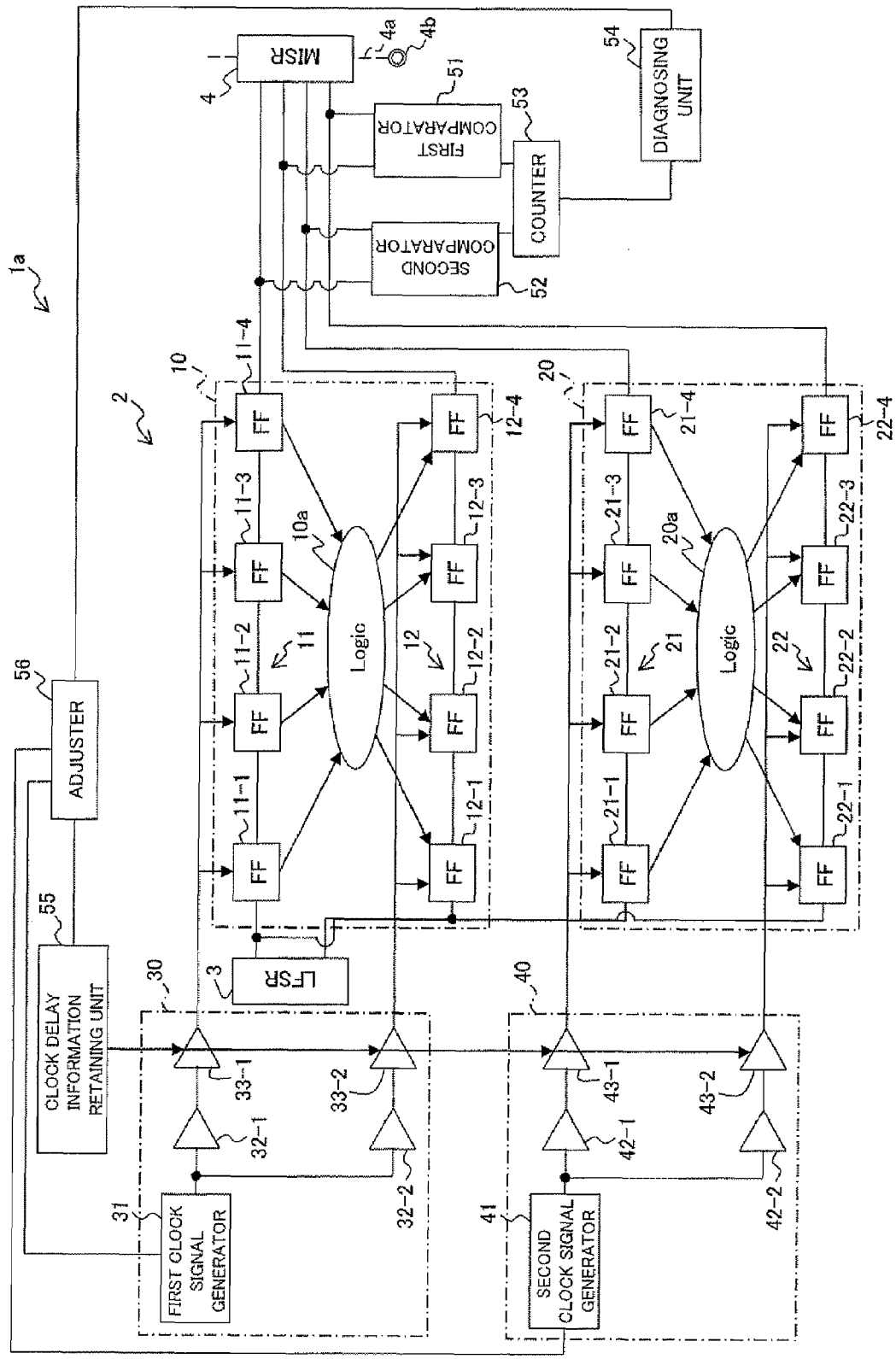
FIG. 1 is a diagram showing a structure of a timing failure remedying apparatus for an integrated circuit according to a first embodiment of this invention.

First, description will be made of a structure of a timing failure remedying apparatus for an integrated circuit according to a first embodiment of this invention, with reference to FIG. 1. As shown in FIG. 1, the timing failure remedying apparatus for an integrated circuit 1a according to this embodiment diagnoses and remedies a timing failure in an integrated circuit [for example, an LSI (Large Scale Integration)] 2 having a plurality (two, here) of CPU (Central Processing Unit) cores (processing cores) 10 and 20.

The timing failure remedying apparatus 1a comprises an LFSR (Linear Feedback Shift Register; pattern generator) 3, an MISR (Multiple Input Signature Register) 4, a first clock signal applying unit 30, a second clock signal applying unit 40, a first comparator (comparator) 51, a second comparator 52, a counter 53, a diagnosing unit 54, a clock delay setting information retaining unit (delay amount setting information retaining unit) 55, and an adjuster 56. Scan chains 11, 12, 21 and 22 to be described later of the CPU cores 10 and 20 also function as the timing failure remedying apparatus 1a.

Further, the LFSR 3, the MISR 4, the scan chains 11, 12 21 and 22, the first clock signal applying unit 30, the second clock signal applying unit 40, the first comparator 51, the second comparator 52, the counter 53 and the diagnosing unit 54 function together as the timing failure remedying apparatus 1a of this invention.

In this embodiment, at least the LFSR 3, the MISR 4, and the CPU cores 10 and 20 suffice the integrated circuit 2. The first clock signal applying unit 30, the second clock signal applying unit 40, the first comparator 51, the second comparator 52, the counter 53, the diagnosing unit 54, the clock delay setting information retaining unit 55 and the adjuster 56 unctioning together as the timing failure remedying apparatus 1a may be provided in the integrated circuit 2, or outside the integrated circuit 2.

First, the CPU cores 10 and 20 will be described. The CPU cores 10 and 20 have logic circuits (denoted as "Logic" in the drawing) 10a and 20a of the same logic. Therefore, when the same input or setting value is given to the CPU cores 10 and 20 (logic circuits 10a and 20a), the same output value can be obtained.

This embodiment will be described, taking an example where the CPU core 10 is made function for reference, whereas the CPU core 20 is made function to be tested when a timing failure is diagnosed.

The CPU core (processing core for reference) 10 comprises the inputting scan chain (input scan chain for reference) 11 for inputting a test pattern generated by the LFSR 3 to the logic circuit (logic circuit for reference) 10a, and a taking-out scan chain (taking-out scan chain for reference) 12 for taking out values obtained on the basis of the test pattern (that is, values obtained by that the test pattern is passed through the logic circuit 10a and undergone a process by the logic circuit 10a) from the logic circuit 10a.

Like the CPU core 10, the CPU core (processing core unit to be tested) 20 has the inputting scan chain (inputting scan chain to be tested) 21 for inputting the test pattern generated by the LFSR 3 into the logic circuit (logic circuit to be tested) 20a, and the taking-out scan chain (taking-out scan chain to be tested) 22 for taking out values obtained on the basis of the test pattern from the logic circuit 20a.

The scan chains 11, 12, 21 and 22 have the same structure, each of which comprises four flip-flops (denoted as "FF" in the drawing) connected in series.

Here, the scan chain 11 comprises flip-flops 11-1 through 11-4, the scan chain 12 comprises flip-flops 12-1 through 12-4, the scan chain 21 comprises flip-flops 21-1 through 21-4, and the scan chain 22 comprises flip-flops 22-1 through 22-4.

Each of the scan chains 11, 12, 21 and 22 originally fulfils both functions as the inputting scan chain and the taking-out scan chain. However, this embodiment will be described mainly, by taking an example where the scan chains 11 and 21 function as the inputting scan chains, whereas the scan chains 12 and 22 function as the taking-out scan chains.

Now, the flip-flops 11-1 through 11-4 and 21-1 through 21-4 (hereinafter, referred to simply as flip-flops without the reference characters when these flip-flops are not specifically discriminated from one another) of the scan chains 11, 12 21 and 22 will be described with reference to FIGS. 1 through 4.

Figure 2:
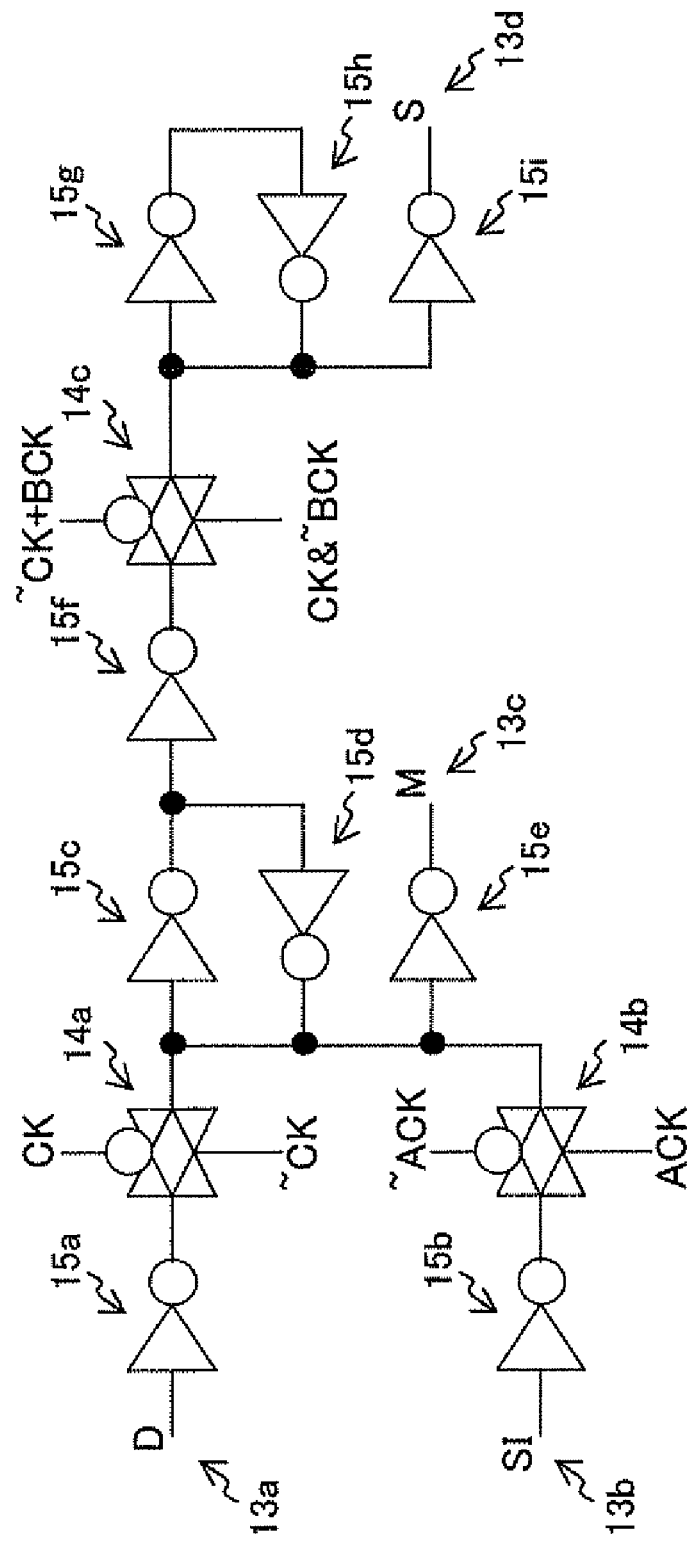
FIG. 2 is a diagram showing an example of structure of a flip-flop in a scan chain of the timing failure remedying apparatus for an integrated circuit according to the first embodiment of this invention.

The flip-flop comprises, as shown in FIG. 2, a data input terminal (denoted as "D" in the drawing) 13a, a scan-in input terminal (denoted as "SI" in the drawing) 13b, a master output terminal (denoted as "M" in the drawing) 13c, a slave output terminal (denoted as "S" in the drawing) 13d, clock inputting units 14a through 14c and NOT gates 15a through 15i.

A clock signal for system operation (denoted as "CK" in the drawing) operating the CPU core is inputted to the clock input unit 14a, an inverted signal of A clock signal (denoted as "~ACK" in the drawing) for scan operation is inputted to the clock inputting unit 14b, and a logical sum of the inverted signal of the clock signal for system operation and B clock signal (denoted as "BCK" in the drawing ) for scan operation is inputted to the clock inputting unit 14c.

Figure 3:
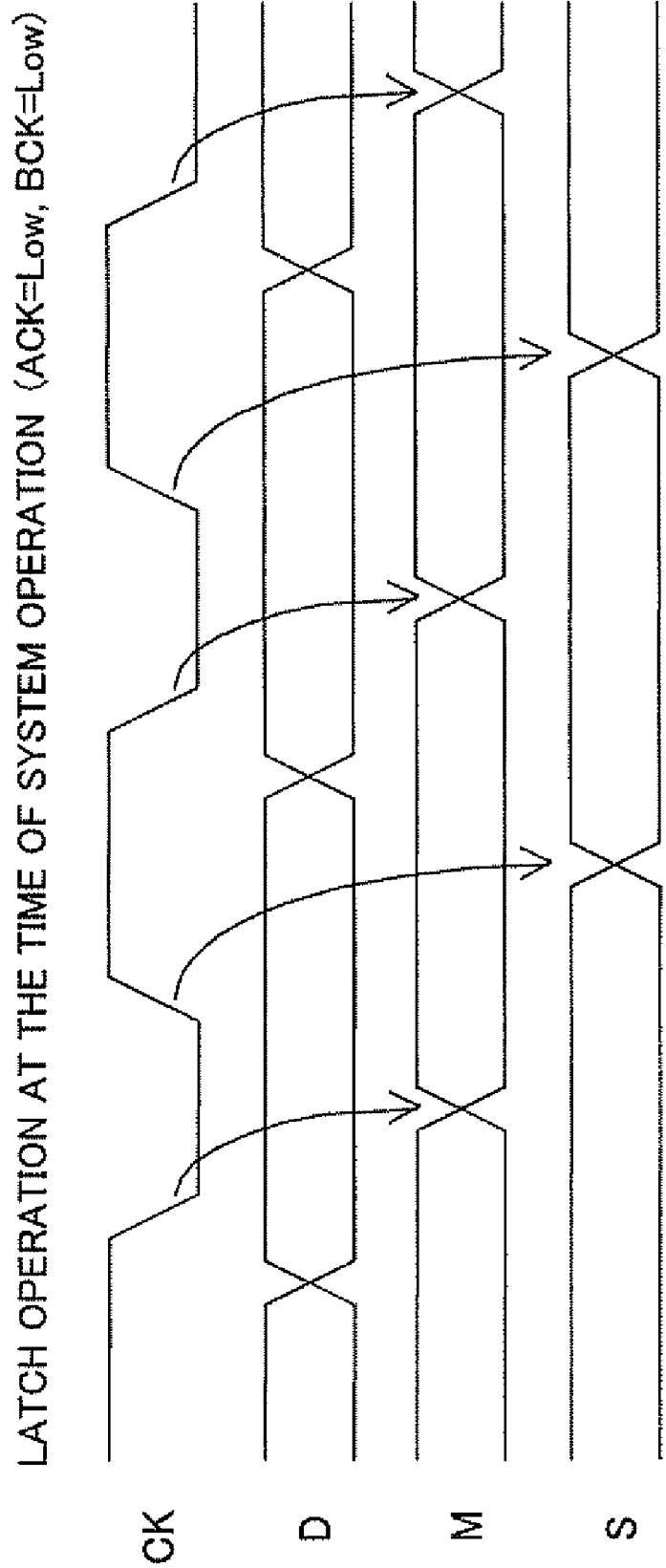
FIG. 3 is a time chart for illustrating an example of operation at the time of system operation of the flip-flop shown in FIG. 2.

As shown in FIG. 3, at the time of the system operation, data is captured from the data input terminal 13a in synchronization with the clock signal CK for system operation, the data is outputted from the master output terminal 13c in correspondence with rise of the clock signal CK, and the data is outputted from the slave output terminal 13d in correspondence with rise of the clock signal CK. Note that the clock signals ACK and BCK for scan operation are in OFF ("Low") state at this time.

Figure 4:
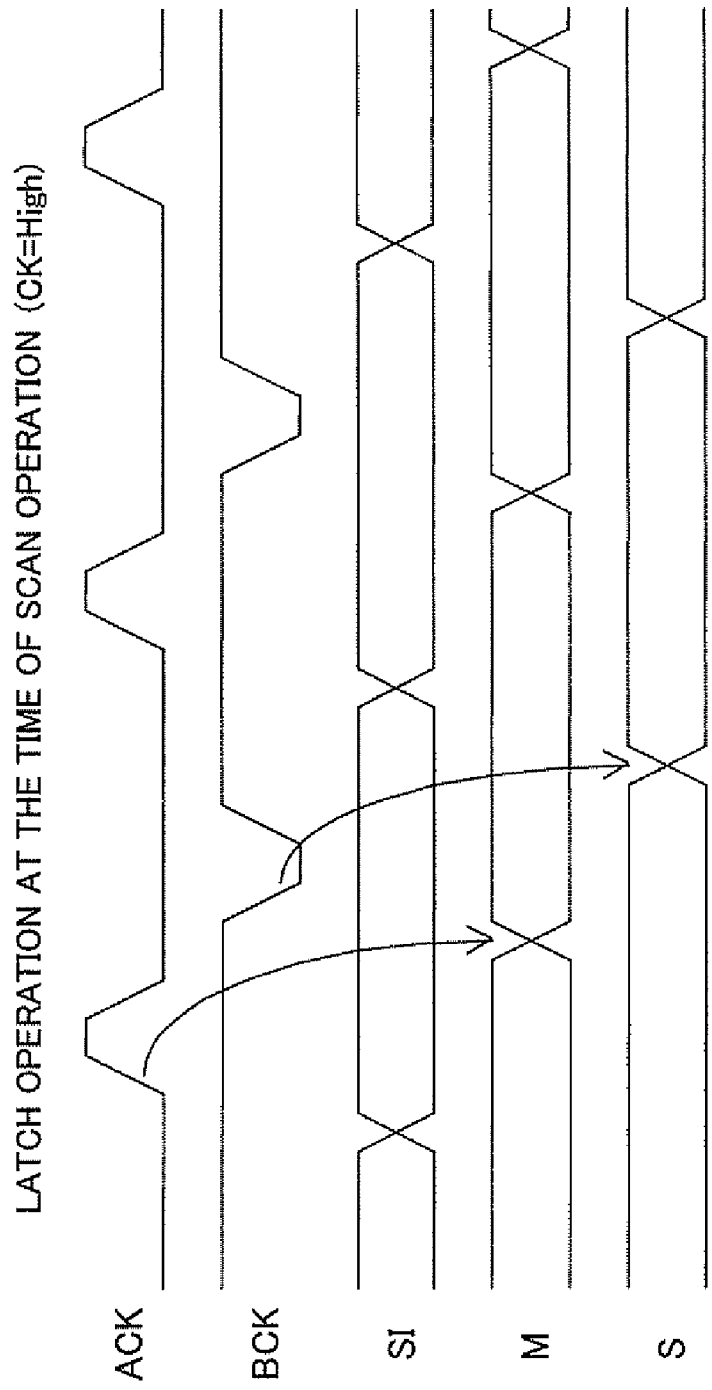
FIG. 4 is a time chart for illustrating an example of operation at the time of scan operation of the flip-flop shown in FIG. 2.

At the time of scan operation, as shown in FIG. 4, by alternately switching the clock signals ACK (+ACK) and BCK (−BCK) to ON, data is outputted from the master output terminal 13c in correspondence with rise of the clock signal ACK for scan operation, and the data is outputted from the slave output terminal 13d in correspondence with fall of the clock signal BCK for scan operation. Note that the clock signal CK for system operation is in ON ("High") state at this time.

Since the data is propagated from the scan-in input terminal 13b to the slave output terminal 13d, it is possible to form each of the scan chains 11, 12, 21 and 22 by connecting these paths of the flip-flops in series in order.

The LFSR 3 generates test patterns for the logic BIST. The test patterns generated by the LFSR 3 are successively held in the scan chains 11, 12, 21 and 22.

Here, the same test pattern generated by the LFSR 3 is inputted to the inputting scan chains 11 and 21, and the same test pattern generated by the LFSR 3 is inputted to the taking-out scan chains 12 and 22.

The MISR 4 converts values, which are resultants of the operations of the CPU cores 10 and 20 on the test pattern generated by the LFSR 3, outputted from the scan chains 11, 12, 21 and 22 into signatures to compress them, and stores the signatures.

The signature values obtained by the MISR 4 are outputted from an output terminal 4b through a scan path 4a.

The first clock signal applying unit 30 applies a clock signal (first clock signal) for system operation operating the CPU core 10 to the CPU core 10. The first clock signal applying unit 30 comprises a first clock signal generator 31 for generating the clock signal, and an inputting mechanism (clock distribution) in two systems for inputting the clock signal generated by the first clock signal generator to the CPU core 10. Incidentally, the first clock signal generator 31 can change the cycle of the generated clock signal.

The first clock signal generator 31 may be accomplished by a PLL (Phase Locked Loop) disposed in the integrated circuit 2, or may be disposed outside the integrated circuit 2.

The first clock signal applying unit 30 comprises a clock signal inputting circuit 32-1 for inputting the clock signal generated by the first clock signal generator 31 to the input scan chain 11, a delay adjusting circuit 33-1 for adjusting a delay amount of the clock signal from the clock signal inputting circuit 32-1, a clock signal inputting circuit 32-2 for inputting the clock signal generated by the first clock signal generator 31 to the taking-out scan chain 12, and a delay adjusting circuit 33-2 for adjusting a delay amount of the clock signal from the clock signal inputting circuit 32-2.

Clock signals for shifting values held in the flip-flops 11-1 through 11-4 and 12-1 through 12-4 are separately generated by a signal applying mechanism not shown, and applied to the scan chains 11 and 12.

Figure 5:
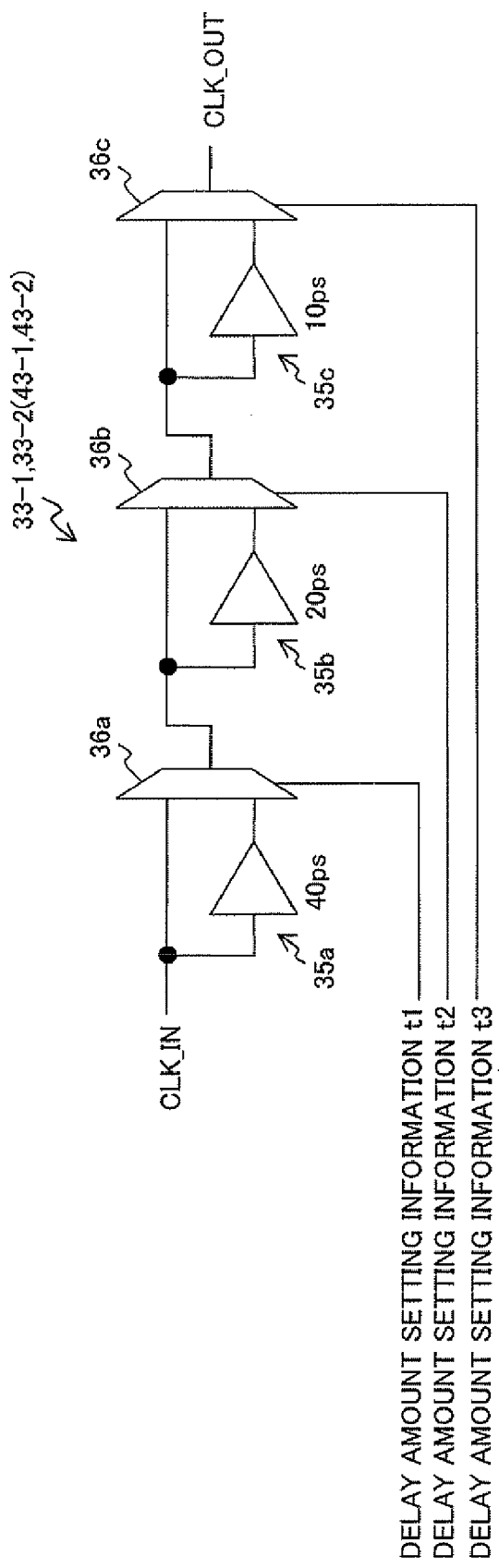
FIG. 5 is a diagram showing an example of structure of a delay adjusting circuit of a first clock signal applying unit and a delay adjusting circuit of a second clock signal applying unit of the timing failure remedying apparatus for an integrated circuit according to the first embodiment of this invention.

Each of the delay adjusting circuits 33-1 and 33-2 delays the clock signal on the basis of delay amount setting information retained in the clock delay setting information retaining unit 55, configured as shown in FIG. 5, for example.

Each of the delay adjusting circuits 33-1 and 33-2 comprises gates 35a through 35c for retaining predetermined values, and selectors 36a through 36c corresponding to the respective gates 35a through 35c to adjust a delay amount of the clock signal according to three pieces of the delay amount setting information t1 through t3 retained in the clock delay setting information retaining unit 55.

Concretely, the gate 35a retains a delay amount of 40 ps, the gate 35b a delay amount of 20 ps, and the gate 35c a delay amount of 10 ps.

Accordingly, each of the delay adjusting circuits 33-1 and 33-2 determines to select which delay amount in the gate 35a, 35b or 35c according to the three pieces of delay amount setting information t1 through t3, whereby the clock signal is delay within a range from 0 ps to 70 ps.

The second clock signal applying unit 40 applies a clock signal (second clock signal) for system operation, which is to operate the CPU core 20, to the CPU 20. The second clock signal applying unit 40 has a structure similar to that of the first clock signal applying unit 30.

The second clock signal applying unit 40 comprises a second clock signal generator 41 for generating a clock signal, and an inputting mechanism in two systems for inputting the clock signal generated by the second clock signal generator 41 to the CPU core 20. Incidentally, the second clock signal generator 41 can change the cycle of the generated clock signal, as well.

The second clock signal generator 41 may be accomplished by a PLL disposed in the integrated circuit 2, or may be disposed outside the integrated circuit 2.

The second clock signal generator 40 comprises a clock signal inputting circuit 42-1 for inputting the clock signal to the inputting scan chain 21, a delay adjusting circuit 43-1 for adjusting a delay amount of the clock signal from the clock signal inputting circuit 42-1, a clock signal inputting circuit 42-2 for inputting the second clock signal to the taking-out scan chain 22, and a delay adjusting circuit 43-2 for adjusting a delay amount of the clock signal from the clocks signal inputting circuit 42-2.

Clock signals for scan paths which are used to shift values held in the flip-flops 21-1 through 21-4 and 22-1 through 22-4 are separately generated by a signal applying mechanism not shown, and applied to the scan chains 21 and 22.

The delay adjusting circuits 43-1 and 43-2 have the same structure as the delay adjusting circuits 33-1 and 33-2 shown in FIG. 5.

In the timing failure remedying apparatus 1a, when the integrated circuit 2 is identified, as a result of a logic BIST using the LFSR 3, the MISR 4 and the like, as that the logic of the logic circuits 10a and 20a in the integrated circuit 2 is normal but the timing failure occurs therein, the first clock signal applying unit 30 applies the first clock signal in a predetermined cycle (first cycle), at which that the CPU core 10 normally operates is assured in the logic BIST, to the CPU core 10 in order to make the CPU core 10 function as a reference, whereas the second clock signal applying unit 40 applies the second clock signal in a cycle (second cycle) different from the above predetermined cycle (here, a shorter cycle than the above predetermined cycle) to the CPU core 20 in order to test the CPU core 20.

Figure 6:
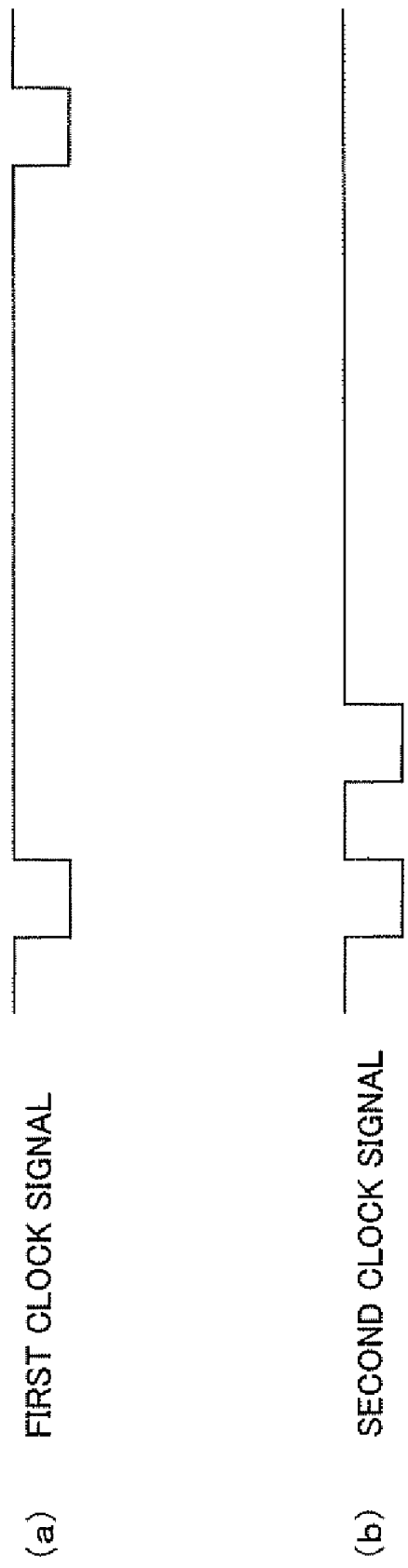
FIGS. 6(a) and 6(b) are diagrams for illustrating clock signals applied by the first clock signal applying unit and the second clock signal applying unit of the timing failure remedying apparatus for an integrated circuit according to the first embodiment of this invention; where

For example, the clock signal is applied two times in such predetermined cycle that the CPU core 10 normally operates as shown in FIG. 6(*a*), whereas the second clock signal is applied two times in a much shorter cycle (here, a ⅓ cycle) than that of the first clock signal as shown in FIG. 6(*b*). In the CPU core 20 to be tested, when the test pattern is inputted to the logic circuit 20a from the inputting scan chain 21 at an interval of two clocks of the second clock signal, values passing through the logic circuit 20a should be taken out to the scan chain 22. If not, it is confirmed that a timing failure occurs in the CPU core 20.

The first comparator 51 compares a value captured in the taking-out scan chain 12 from the logic circuit 10a for reference of the CPU core 10, which is obtained by operating the CPU core 10 functioning for reference according to the first clock signal applied by the first clock signal applying unit 30, with a value captured in the taking-out scan chain 22 from the logic circuit 20a to be tested, which is obtained by operating the CPU core 20 to be tested according to the second clock signal applied by the second clock signal applying unit 40.

More concretely, the first comparator 51 compares a value held in the flip-flop 12-4 in the final stage of the taking-out scan chain 12 of the CPU core 10 with a value held in the flip-flop 22-4 in the final stage of the inputting scan chain 22 of the CPU core 20.

The second comparator 52 compares a value held in the inputting scan chain 11 after the CPU core 10 for reference is operated according to the first clock signal applied by the first clock signal applying unit 30 with a value held in the inputting scan chain 21 after the CPU core 20 to be tested is operated according to the second clock signal applied by the second clock signal applying unit 40.

More concretely, the second comparator 52 compares a value held in the flip-flop 11-4 in the final stage of the inputting scan chain 11 of the CPU core 10 with a value held in the flip-flop 21-4 in the final stage of the inputting scan chain 21 of the CPU core 20.

As above, the first comparator 51 and the second comparator 52 are disposed in front of the MISR 4. The first comparator 51 directly compares values held in the flip-flops 12-4 and 22-4 before converted into signatures by the MISR 4, whereas the second comparator 52 directly compares values held in the flip-flops 11-4 and 21-4 before converted into signatures by the MISR.

The counter 53 counts at least results of comparison made by the first comparator 51 (here, the number of times of occurrence of a result that a value held in the flip-flop 12-4 differs from a value held in the flip-flop 22-4) within a predetermined time period. Here, the counter 53 counts results of the comparison made by the second comparator 52 (here, the number of times of occurrence of a result that a value held in the flip-flop 11-4 differs from a value held in the flip-flop 21-4), in addition to results of the comparison by the first comparator 51.

Comparing values in the taking-out scan chains (here, the scan chains 12 and 22) with each other is sufficient to examine a timing failure in the logic circuit 20a. However, since the scan chains 11, 12, 21 and 22 function both as the inputting scan chains and the taking-out scan chains, there is provided the second comparator 52. The counter 53 counts not only results of comparison by the first comparator 51 but also results of comparison by the second comparator 52, whereby a timing failure can be detected even when the scan chains 11 and 21 operate as the taking-out scan chains, and the mechanism diagnosing the timing failure (the first comparator 51, the second comparator 52, the counter 53 and the diagnosing unit 54) can diagnose, with certainty, a timing failure in the logic circuit 20a to be tested without being conscious of whether each of the scan chains 11, 12, 21 and 22 operates as the taking-out scan chain or the inputting scan chain during the test.

The diagnosing unit 54 diagnoses a timing failure in the logic circuit 20a to be tested on the basis of results of comparison by the first comparator 51 and the second comparator 52. When it is determined as results of comparison by the first comparator 51 and the second comparator 52 that a value captured in the taking-out scan chain for reference (here, the scan chain 12) and a value captured in the taking-out scan chain to be tested (here, the scan chain 22) differ from each other, the diagnosing unit 54 pronounces a diagnosis that a timing failure occurs in the logic circuit 20a to be tested.

Here, the diagnosing unit 54 detects the number of timing failures of the logic circuit 20a to be tested on the basis of a value of the counter 53.

The clock delay setting information retaining unit 55 retains delay amount setting information for setting delay amounts of the first clock signal and the second clock signal to be applied by the first clock signal applying unit 30 and the second clock signal applying unit 40, respectively. Concretely, the clock delay setting information retaining unit 55 retains delay amount setting information for each of the delay adjusting circuits 33-1, 33-2, 43-1 and 43-2.

Figure 7:
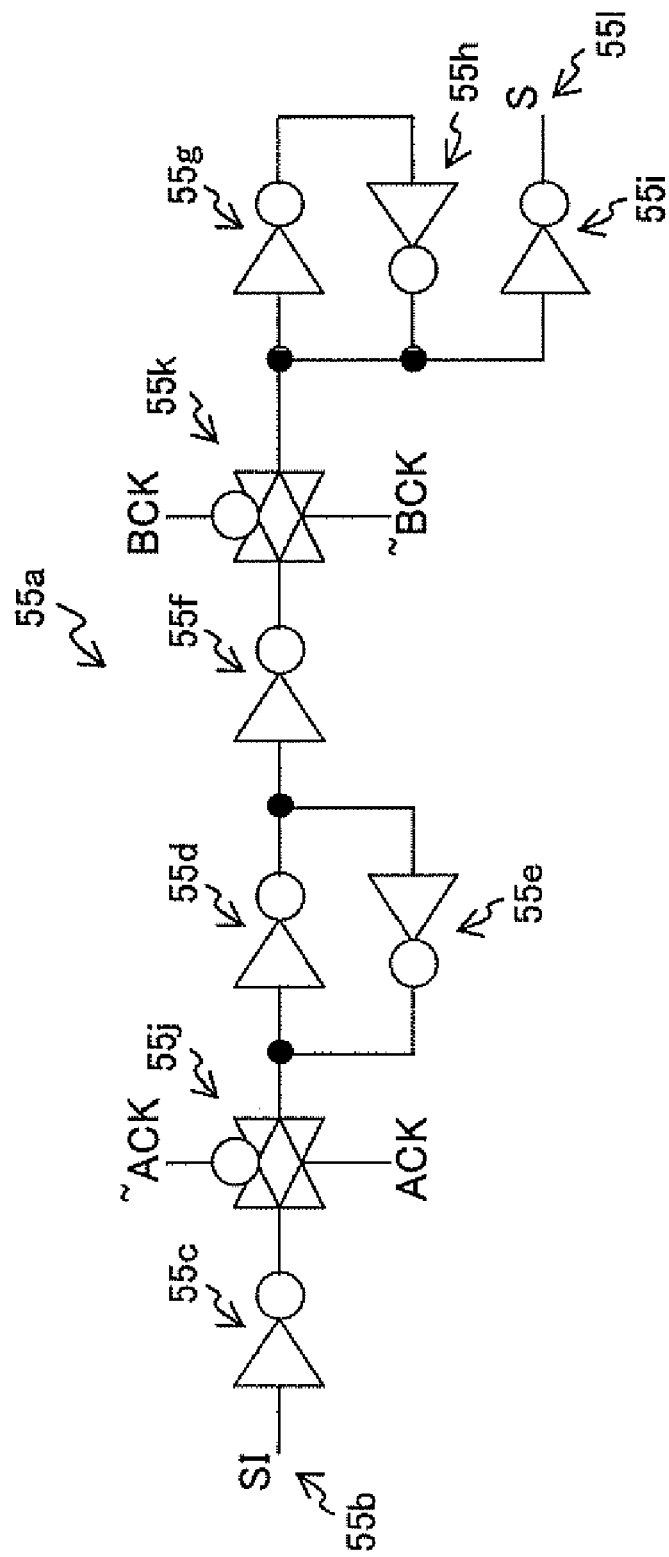
FIG. 7 is a diagram showing an example of structure of a flip-flop of a clock delay setting information retaining unit of the timing failure remedying apparatus for an integrated circuit according to the first embodiment of this invention.

The clock delay setting information retaining unit 55 has a plurality (here, three for each delay adjusting circuit) of flip-flops (flip-flop for scan only) 55a as shown in FIG. 7 for each of the delay adjusting circuits 33-1, 33-2, 43-1 and 43-2.

The flip-flop 55a keeps retaining and outputting a value inputted from an SI input terminal (denoted as "SI" in the drawing) without changing it according to the clock. The flip-flop 55a comprises a plurality of NOT gates 55c through 55i, a clock inputting unit 55j to which an inverted signal of the clock signal ACK is inputted, a clock inputting unit 55k to which clock signal BCK is inputted and an output terminal (denoted as "S" in the drawing) 55l outputting the retained value to a corresponding delay adjusting circuit according to the clock signals ACK and BCK.

When the diagnosing unit 54 determines that a timing failure occurs in the logic circuit 20a to be tested, the adjuster 56 adjusts at least either the cycle or the delay amount of the second clock signal to be applied to the CPU core 20 to be tested by the second clock signal applying unit 40 in order to remedy the timing failure.

Further, the adjuster 56 adjusts at least either the cycle or the delay amount of the second clock signal so that the value of the counter 53 is decreased. For example, the adjuster 56 adjusts the delay amount by using a genetic algorithm suggesting that the smaller the value of the counter 53, the larger the adaptivity is (that is, the smaller the count value, the higher the evaluation is).

The adjuster 56 adjusts the delay amount of the second clock signal by controlling the second clock signal generator 41 to adjust the cycle of the second clock signal or by changing the delay amount setting information set to the delay adjusting circuits 43-1 and 43-2 retained in the clock delay setting information retaining unit 55.

When the scan chain 22 operates as the taking-out scan chain, the adjuster 56 has to only adjust the delay amount setting information set to the delay adjusting circuit 43-2 retained in the clock delay amount information retaining unit 55.

Generally, when plural clocks are applied to the CPU core (the CPU core 20 to be tested) in a short cycle, over-delay becomes noticeable. However, when the second clock signal is further changed, the over-delay failure may be cancelled, or new over-delay failure may occur adversely, or a racing failure may occur because the second clock signal is obtained by changing the predetermined cycle (default value) of the first clock signal.

The final object of the adjuster 56 is to determine a clock timing setting value (that is, a cycle and a delay amount of the second clock signal) at which the over-delay failure and the racing failure do not occur. Therefore, the adjustment by the adjuster 56 makes the cycle of the second clock signal longer, or the delay amount larger, basically. There may be a case that the adjuster 56 makes the cycle of the second clock signal shorter or the delay amount smaller according to the number of the timing failures obtained after the preceding adjustment.

Figure 8:
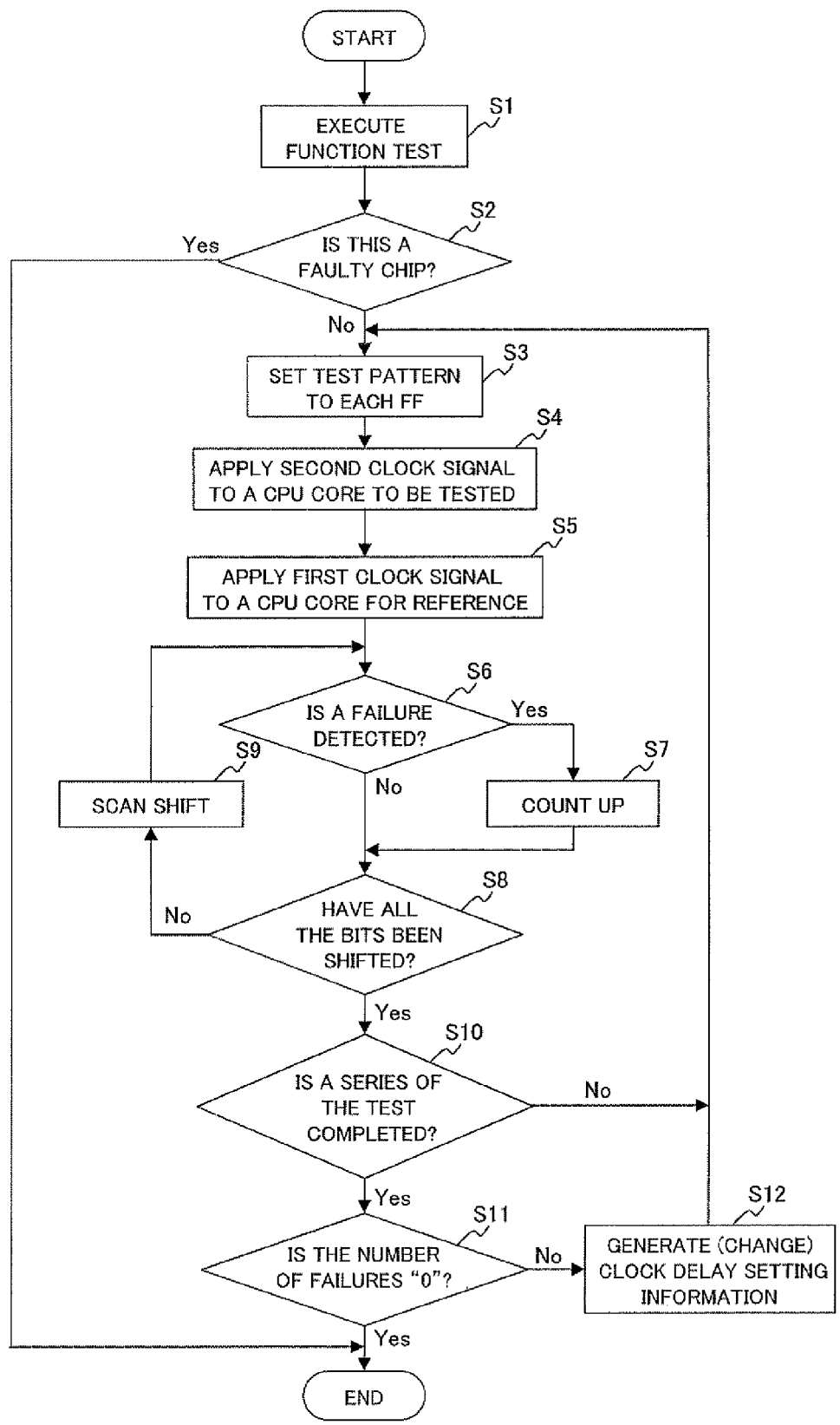
FIG. 8 is a flowchart for illustrating steps of a process according to a timing failure remedying method (timing failure diagnosing method) for an integrated circuit according to the first embodiment of this invention.

Next, description will be made of steps of the operation of the timing failure remedying apparatus 1a (steps of a timing failure correcting method and a timing failure diagnosing method according to the first embodiment of this invention) with reference to a flowchart (steps S1 through S12) shown in FIG. 8. The timing failure diagnosing method according to the first embodiment of this invention includes steps S1 through S11.

First, the timing failure remedying apparatus 1a carries out a function test on the whole integrated circuit 2 with the clock signals (the first clock signal and the second clock signal) being as default values (step S1).

The timing failure remedying apparatus 1a makes a logic BIST with the LFSR 3 and the MISR 4 by using clock signals in such a long cycle that the CPU cores 10 and 20 can normally operate, thereby to determine whether the integrated circuit 2 is a faulty chip or not (step S2). Here, the determination of whether the integrated circuit 2 is a faulty chip or not is made by a tester (not shown), which is disposed inside or outside the integrated circuit 2, and compares a signature value obtained by the MISR 4 with an expectation value thereof.

When the tester determines that the integrated circuit 2 is a faulty chip (Yes route at step S2), the process is terminated. Here, a chip developing a logic failure due to open or short excepting a timing failure or a racing chip is determined to be a faulty chip, and excluded.

On the other hand, when the tester determines that the integrated circuit 2 is not a faulty chip (No route at step S2), the timing failure remedying apparatus 1a examines a timing failure in the integrated circuit 2, and starts a process of remedying the timing failure. Namely, the timing failure remedying apparatus 1a carries out processes at steps S3 through S12 to be described later on the integrated circuit 2, which is determined in the function test that its logic is normal but a timing failure occurs in the CPU cores 10 and 20.

Concretely, a test pattern is generated by the LFSR 3, and set to each of the scan chains 11, 12, 21 and 22 (step S3).

Next, the second clock signal applying unit 40 applies the second clock signal in a shorter cycle than the first clock signal, which is a default value, to the CPU core 20 to be tested, whereby the CPU core 20 carries out the process (step S4). On the other hand, the first clock signal applying unit 30 applies the first clock signal, which is a default value, in a cycle in which the CPU core 10 normally operates to the CPU core 10 for reference (step S5) to generate an expectation value. Incidentally, that this expectation value is a correct value is confirmed in the function test (steps S1 and S2 above) The order in which the processes at step S4 and S5 are performed is not limited in this invention.

Since the integrated circuit 2 is an LSI of a correct logic but developing a timing failure, the integrated circuit 2 should fail if a plurality of pulses are applied as the clock signals in a short cycle, but should not fail even if a plurality of pulses in a long cycle of the default value are applied. In other words, a correct result of the operation can be obtained by operating the integrated circuit 2 with the default value, thus the CPU core 20 having the logic circuit 20a of the same logic as the logic circuit 10a of the CPU core 10 can be used as an examinee.

The first comparator 51 determines whether a value in the flip-flop 22-4 in the final stage of the taking-out scan chain 22 to be tested obtained as a result of the operation by the logic circuit 20a is correct or not, by comparing the value with an obtained value in the flip-flop 12-4 in the final stage of the taking-out scan chain 12 for reference (step S6).

Namely, when it is determined as a result of comparison by the first comparator 51 that an obtained value in the flip-flop 22-4 and an obtained value in the flip-flop 12-4 differ from each other (that is, when a timing failure is detected; Yes route at step S6), the counter 53 counts up its value by one (step S7). Conversely, when the obtained value in the flip-flop 22-4 and the obtained value in the flip-flop 12-4 are identical (that is, no timing failure is detected; No route at step S6), the process at the above step S7 is not carried out.

When the scan chains 11 and 21 operate as the inputting scan chains, the comparison by the second comparator 52 makes no sense for the diagnosis of a timing failure (that is, a result of the comparison always matches). However, when the scan chains 12 and 22 operate as the inputting scan chain whereas the scan chains 11 and 21 operate as the taking-out scan chain, a result of comparison by the second comparator 52 can be used for the diagnosis of a timing failure.

In order to perform the process at the above step S6 on all values retained in the scan chains 12 and 22, when shift of all the bits is not completed (No route at step S8), the scan chains 11, 12, 21 and 22 (particularly, the taking-out scan chains 12 and 22) are scan-shifted by only one (step S9), obtained values in the flip-flops 12-3 and 22-3 are shifted to the flip-flops 12-4 and 22-4, respectively, and the processes at the above steps S6 to S8 are carried out.

When the shift of all the bits is completed (that is, the comparing process by the first comparator 51 is carried out on all the values in the flip-flops 22-1 through 22-4; Yes route at step S8), the diagnosing unit 54 determines whether the series of the test is completed or not (for example, whether the test is completed on all the test patterns used for the test) (step S10) When a series of the test is not completed (No route at step S10), the procedure proceeds to the process at the above step S3 in order to carry out the test with a new test pattern.

When a series of the test is completed (Yes route at step S10), the diagnosing unit 54 examines presence/absence of the timing failure and the number of the timing failures in the logic circuit 20 of the CPU core 20 to be tested according to the value of the counter 53 (step S11).

When the value (the number of the timing failures) of the counter 53 is not "0" and the diagnosing unit 54 thereby determines that there occurs a timing failure (No route at step S11) the adjuster 56 adjusts the cycle and/or the delay amount of the second clock signal on the basis of the genetic algorithm or the like suggesting that the smaller the counter value, the higher the evaluation is, in order to remedy the timing failure. Here, the adjuster 56 newly generates (changes) the delay amount setting information retained in the clock delay setting information retaining unit 55 so that the value of the counter becomes "0" (step S12), and the procedure goes back to the process at the above step S3.

While it is continuously determined that the value of the counter 53 is not "0" and the timing failure is present at the above step S11, the processes at the above steps S3 through S12 are repeated to gradually decrease the value (the number of the timing failures) of the counter 53. When it is finally determined that the value of the counter 53 is "0" and the diagnosing unit 54 thereby determines that there occurs no timing failure (Yes route at step S11), the process is terminated.

According to the first embodiment of this invention, the timing failure remedying apparatus 1a for an integrated circuit has a plurality of the CPU cores 10 and 20 having the respective logic circuits 10a and 20a of the same logic. With respect to the integrated circuit 2 diagnosed in the logic BIST as a timing failure although having normal logic, the first clock signal applying unit 30 applies the first clock signal in a predetermined cycle (default value) to slowly operate a CPU core 10 for reference so that a correct value can be obtained as a reference, whereas the second clock signal applying unit 40 applies the second clock signal in a cycle (here in a short cycle) differing from the predetermined cycle to operate the other CPU core 20, which is a testee, at a high speed. At this time, the same test pattern generated by the LFSR 3 is set to the inputting scan chains 11 and 21 of the CPU cores 10 and 20, the first comparator 51 compares a normal value (expectation value) obtained from the CPU core 10 for reference (that is, a value captured in the taking-out scan chain 12) with a value obtained from the CPU core 20 to be tested (that is, a value captured in the taking-out scan chain 22). The diagnosing unit 54 pronounces a diagnosis that a timing failure occurs in the logic circuit 20a on the basis of the comparison by the first comparator 51 when these values are different from each other. Since the diagnosing unit 54 makes a diagnosis with the CPU core 10 being for reference and the CPU core 20 being to be tested, the diagnosing unit 54 can specify the taking-out scan chain 22 involving a value signifying a timing failure in the integrated circuit 2, thus can, with certainty, identify a timing failure of the logic circuit 20a, as a result.

When receiving a result of a diagnosis from the diagnosing unit 54 that a timing failure occurs in the logic circuit 20a, the adjuster 56 adjusts the cycle and/or the delay amount (concretely, the delay amount setting information) of the second clock signal, whereby a position at which the timing failure occurs can be specified and the timing failure can be remedied, with certainty and effectively.

The timing failure remedying apparatus 1a can overcome a disadvantage of the known logic BIST that a failure position (faulty scan chain or faulty logic circuit) cannot be specified, while making the best use of the test time shortening effect that is an advantage of the logic BIST, and can remedy the timing failure, that is, carry out timing adjustment, in the integrated circuit 2, with certainty and effectively. This can increase the speed of the integrated circuit 2 and improve the yield that can be decreased due to timing failure, as a result.

When adjusting the second clock signal, the adjuster 56 adjusts the delay amount setting information retained in the clock delay setting information retaining unit 55, which allows certain adjustment of the delay amount of the second clock signal.

Further, the cycle of a clock signal generated by the second clock signal generator 41 of the second clock signal applying unit 40 can be changed, and the adjuster 56 directly adjusts the cycle of the second clock signal generated by the second clock signal generator 41, which allows certain adjustment of the cycle of the second clock signal.

The timing failure remedying apparatus 1a has the second comparator 52, and the diagnosing unit 54 diagnoses a timing failure on the basis of a result of comparison by the second comparator 52. Thus, even when the scan chains 11 and 21 operate as the taking-out scan chains whereas the scan chains 12 and 22 operate as the inputting scan chains, the diagnosing unit 54 can diagnose a timing failure in the logic circuit 20a and remedy the timing failure without information about which scan chain 11, 12, 21 or 22 operates as the taking-out scan chain.

Further, the timing failure remedying apparatus 1a has the counter 53, and the diagnosing unit 54 diagnoses a timing failure in the logic circuit 20a on the basis of the value of the counter 53. Accordingly, the diagnosing unit 54 can diagnose the number (degree) of timing failures in the logic circuit 20a.

The adjuster 56 adjusts at least either the cycle or the delay amount of the second clock signal on the basis of the value (that is, the number of timing failures) of the counter 53 so that the value is decreased, whereby the number of the timing failures in the logic circuit 20a can be decreased to "0", with certainty, which leads to efficient remedy of the timing failure.

[2] Second Embodiment of the Invention

Figure 9:
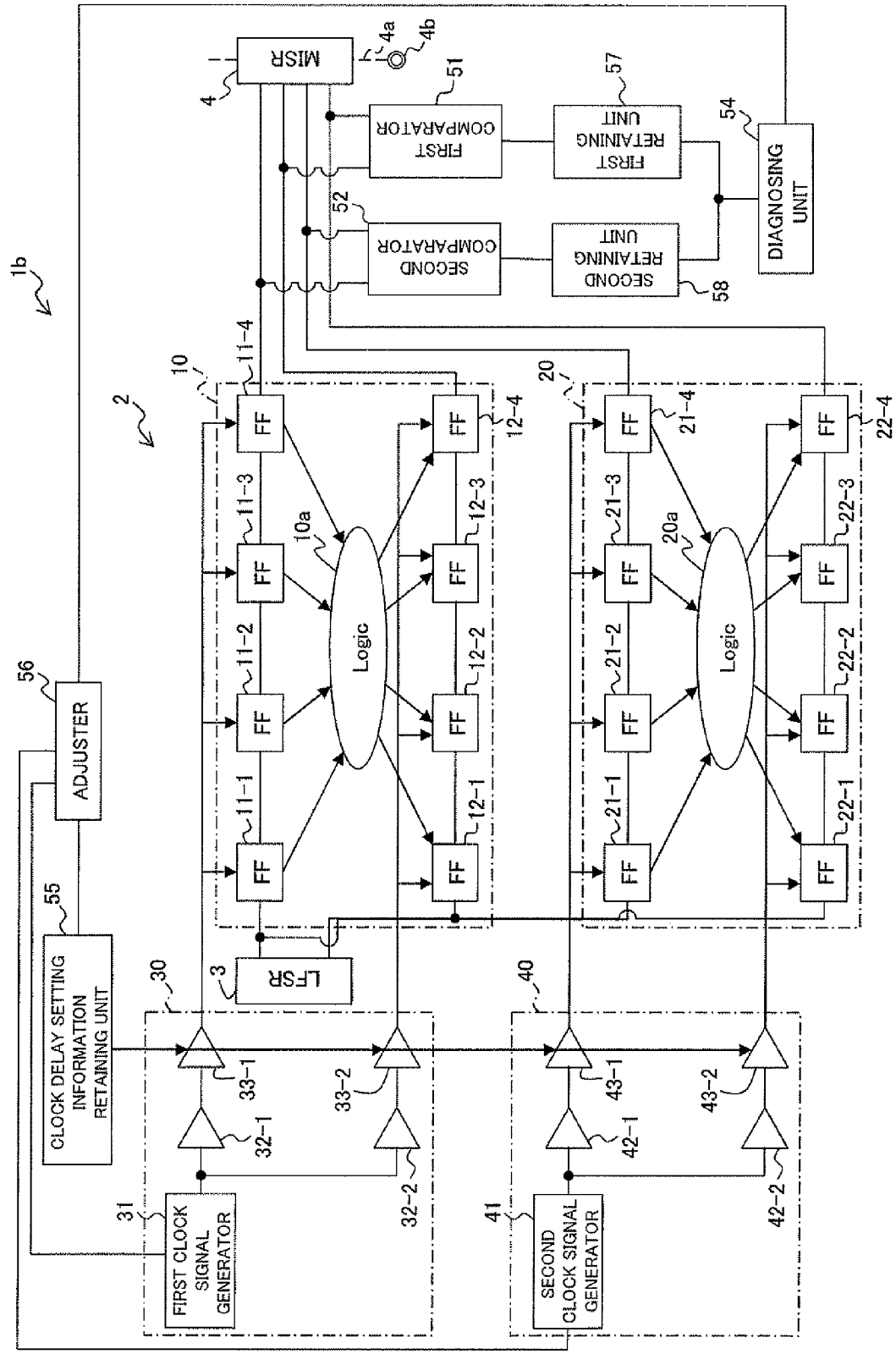
FIG. 9 is a diagram showing a structure of a timing failure remedying apparatus for an integrated circuit according to a second embodiment of this invention.

Next, description will be made of a structure of a timing failure remedying apparatus for an integrated circuit according to a second embodiment of this invention with reference to FIG. 9. As shown in FIG. 9, the timing failure remedying apparatus 1b for an integrated circuit according to this embodiment has the same structure as the timing failure remedying apparatus 1a according to the above-described first embodiment, excepting that the timing failure remedying apparatus 1b has a first retaining unit 57 and a second retaining unit 58 instead of the counter 53 of the first embodiment. Incidentally, like reference characters in FIG. 9 designate like or corresponding parts, detailed descriptions of which are thus omitted here.

The first retaining unit 57 retains a result of comparison by the first comparator 51. Concretely, the first retaining unit 57 is a flag. When it is determined that an expectation value obtained in the flip-flop 12-4 in the final stage of the taking-out scan chain 12 differs from a value obtained in the flip-flop 22-4 in the final stage of the taking-out scan chain 22 as a result of comparison by the first comparator 51, the first retaining unit 57 sets the flag to ON ("1"), thereby retaining the result of comparison by the first comparator 51.

The second retaining unit 58 retains a result of comparison by the second comparator 52. Concretely, the second retaining unit 58 is a flag, as well. When it is determined that an expectation value obtained in the flip-flop 11-4 in the final stage of the scan chain 11 differs from a value obtained in the flip-flop 21-4 in the final stage of the scan chain 21 as a result of comparison by the second comparator 52, the second retaining unit sets the flag to ON ("1"), thereby retaining the result of comparison by the second comparator 52.

In the timing failure remedying apparatus 1b of this embodiment, the diagnosing unit 54 specifies a faulty scan chain on the basis of results of comparison retained in the first retaining unit 57 and the second retaining unit 58.

For example, when the flag as being the first retaining unit 57 is ON ("1") and the flag as being the second retaining unit 58 is OFF ("0"), the diagnosing unit 54 specifies the scan chain 22 as a faulty scan chain. Conversely, when the flag as being the first retaining unit 57 is OFF and the flag as being the second retaining unit 58 is ON, the diagnosing unit 54 specifies the scan chain 21 as a faulty scan chain.

Figure 10:
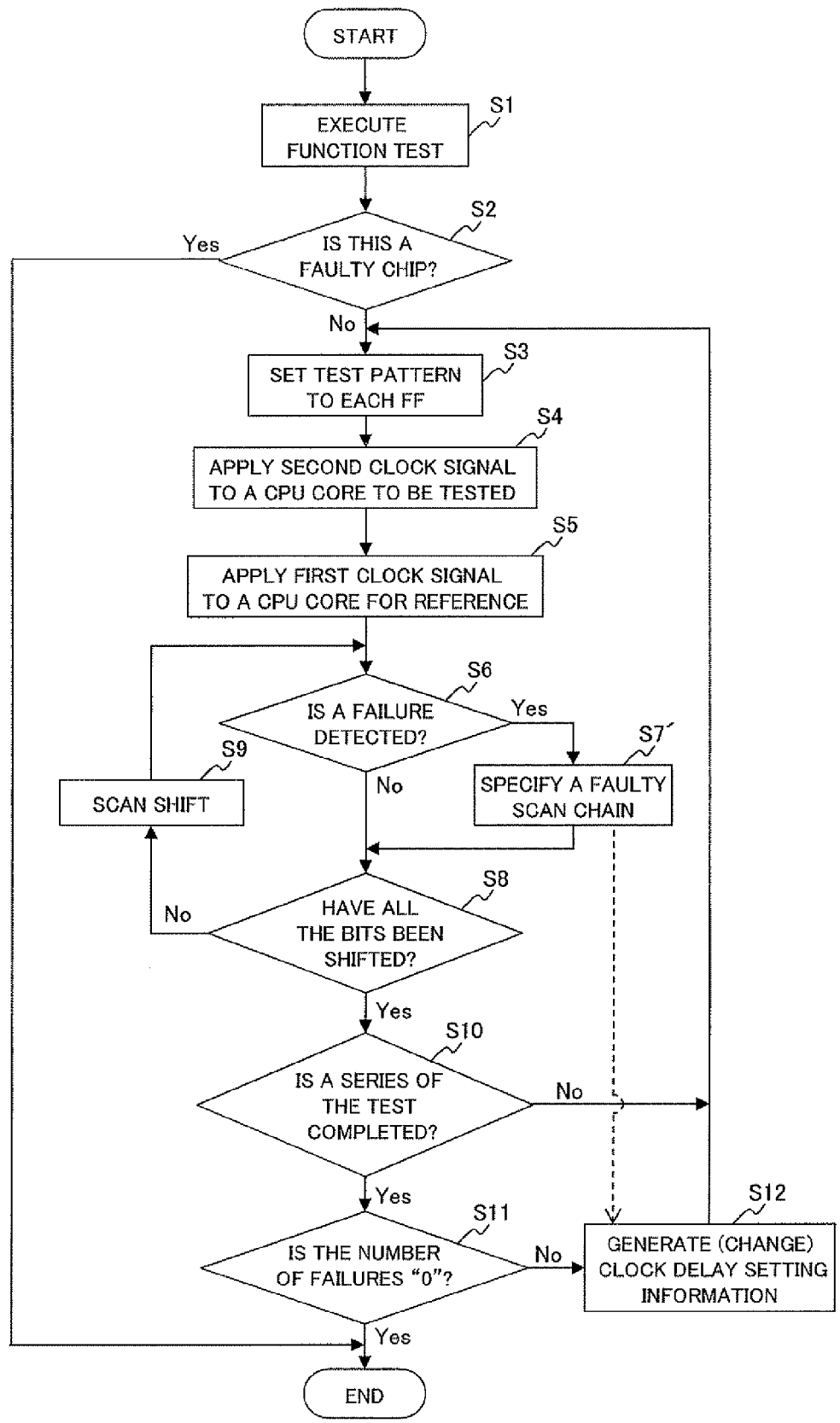
FIG. 10 is a flowchart for illustrating steps of a process according to a timing failure remedying method (timing failure diagnosing method) for an integrated circuit according to the second embodiment of this invention.

Now, description will be made of steps of an operation of the timing failure remedying apparatus 1b with reference to a flowchart (steps S1 through S6, S7', and S8 through S12) in FIG. 10. Incidentally, like reference characters in FIG. 10 designate like or corresponding processes, detailed descriptions of which are thus omitted here.

In the timing failure remedying apparatus 1b, when it is determined that a value obtained in the flip-flop 22-4 differs from a value obtained in the flip-flop 12-4 as a result of comparison by the first comparator 51, or when it is determined that a value obtained in the flip-flop 21-4 differs from a value obtained in the flip-flop 11-4 as a result of comparison by the second comparator (that is, when a timing failure is detected; Yes route at step S6) the flag as being the first retaining unit 57 or the second retaining unit 58 is set to ON, and the diagnosing unit 54 specifies a faulty scan chain on the basis of the flag (step S7').

Incidentally, information (failure position information) on the faulty scan chain specified at this step S7' is retained in a memory area (not shown) of the diagnosing unit 54, for example, and used in a delay amount adjusting process by the adjuster 56 at the following step S12.

Conversely, when the value obtained in the flip-flop 22-4 (21-4) and the value obtained in the flip-flop 12-4 (11-4) are identical (that is, no timing failure is detected; No route at step S6), the process at the above step S7' is not carried out.

At step S12, the adjuster 56 adjusts the cycle and/or the delay amount (here, the delay amount setting information) of a clock signal inputted to the faulty scan chain on the basis of the information on the faulty scan chain specified by the diagnosing unit 54 at the above step S7'.

Here, the integrated circuit 2 is of a structure having the scan chains 11, 12, 21 and 22 for respective blocks for clock distribution. Namely, the integrated circuit 2 is so structured that flip-flops included in each of the scan chains 11, 12, 21 and 22 correspond to each clock distribution (inputting mechanism; here, a pair of the clock signal inputting circuit and the delay adjusting circuit).

Concretely, the clock signal inputting circuits 32-1, 32-2, 42-1 and 42-2 and the delay adjusting circuits 33-1, 33-2, 43-1 and 43-2 are connected to the scan chains 11, 12, 21 and 22, respectively.

Accordingly, it is possible to indirectly specify an inputting mechanism (particularly, the delay adjusting circuit 33-1, 33-2, 43-1 or 43-2) to be adjusted by specifying a faulty scan chain by the diagnosing unit 54, and determine, according to information about which scan chain is faulty, the delay amount setting information on which delay adjusting circuit 33-1, 33-2, 43-1 or 43-2 should be changed.

Accordingly, the adjuster 56 can appropriately change the delay amount setting information on the basis of a faulty scan chain at the above step S12.

For example, when the diagnosing unit 54 specifies that the taking-out scan chain 22 is a faulty scan chain, the adjuster 56 changes the delay amount setting information on the delay adjusting circuit 43-2 retained in the clock delay setting information retaining unit 55.

As describe above, the timing failure remedying apparatus 1b for an integrated circuit according to the second embodiment of this invention can provide the same effects as that of the first embodiment. Additionally, since the diagnosing unit 54 specifies a faulty scan chain in which the timing failure occurs on the basis of results of comparison retained in the first retaining unit 57 and the second retaining unit 58, the adjuster 56 can adjust the delay amount or the like on the basis of the faulty scan chain specified by the diagnosing unit 54. As a result, remedy of the timing failure can be done, more certainly and efficiently.

[3] Third Embodiment of the Invention

Figure 11:
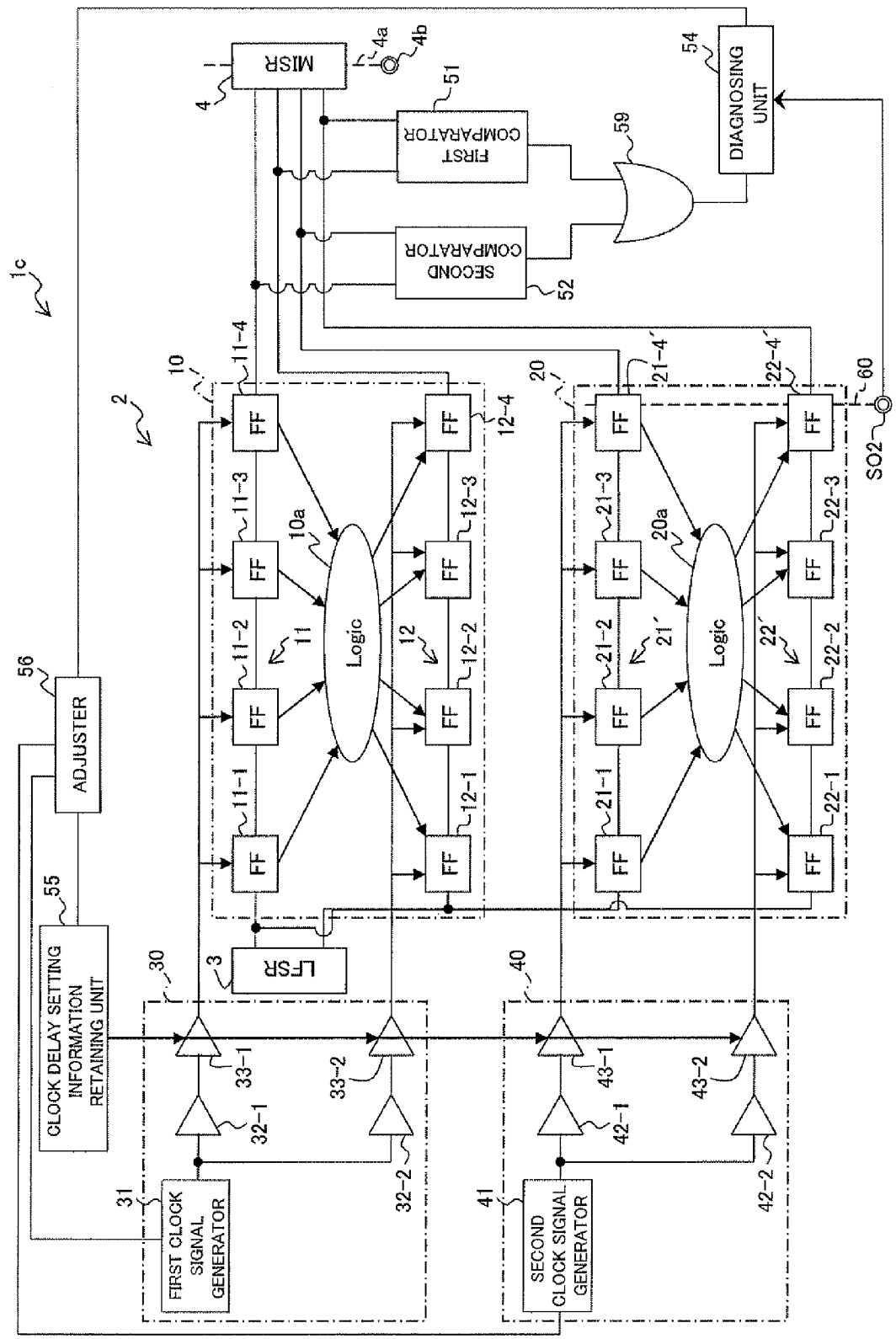
FIG. 11 is a diagram showing a structure of a timing failure remedying apparatus for an integrated circuit according to a third embodiment of this invention.

Next, description will be made of a structure of a timing failure remedying apparatus for an integrated circuit according to a third embodiment of this invention with reference to FIG. 11. As shown in FIG. 11, the timing failure remedying apparatus 1c for an integrated circuit according to this embodiment has a similar structure to that of the timing failure remedying apparatus 1a according to the first embodiment, excepting that the timing failure remedying apparatus 1c has an OR gate 59 instead of the above-described counter 53 of the first embodiment, and structures of scan chains 21' and 22' are different (more concretely, structures of flip-flops 21-4' and 22-4' in the final stage). Incidentally, like reference characters in FIG. 11 designate like or corresponding parts, detailed descriptions of which are thus omitted here.

The OR gate 59 is inputted thereto results of comparison by both the first comparator 51 and the second comparator 52, and outputs a high-level signal (signal indicating "1") as a failure detection signal when at least either one of the results of comparison by the first comparator 51 and the second comparator 52 shows difference (that is, a timing failure is detected).

The diagnosing unit 54 examines presence/absence of a timing failure on the basis of the failure detection signal from the OR gate 59 (that is, the results of comparison by the first comparator 51 and the second comparator 52). When the failure detection signal from the OR gate 59 is "1" and the diagnosing unit 54 pronounces a timing failure, the diagnosing unit 54 directly reads out values retained in the flip-flop 22-4' in the final stage of the taking-out scan chain 22' and the flip-flop 21-4' in the final stage of the inputting scan chain 21' by using a scan path 60 to be described later, and specifies a failure position (faulty flip-flop) at which the timing failure occurs on the basis of the read values.

Figure 12:
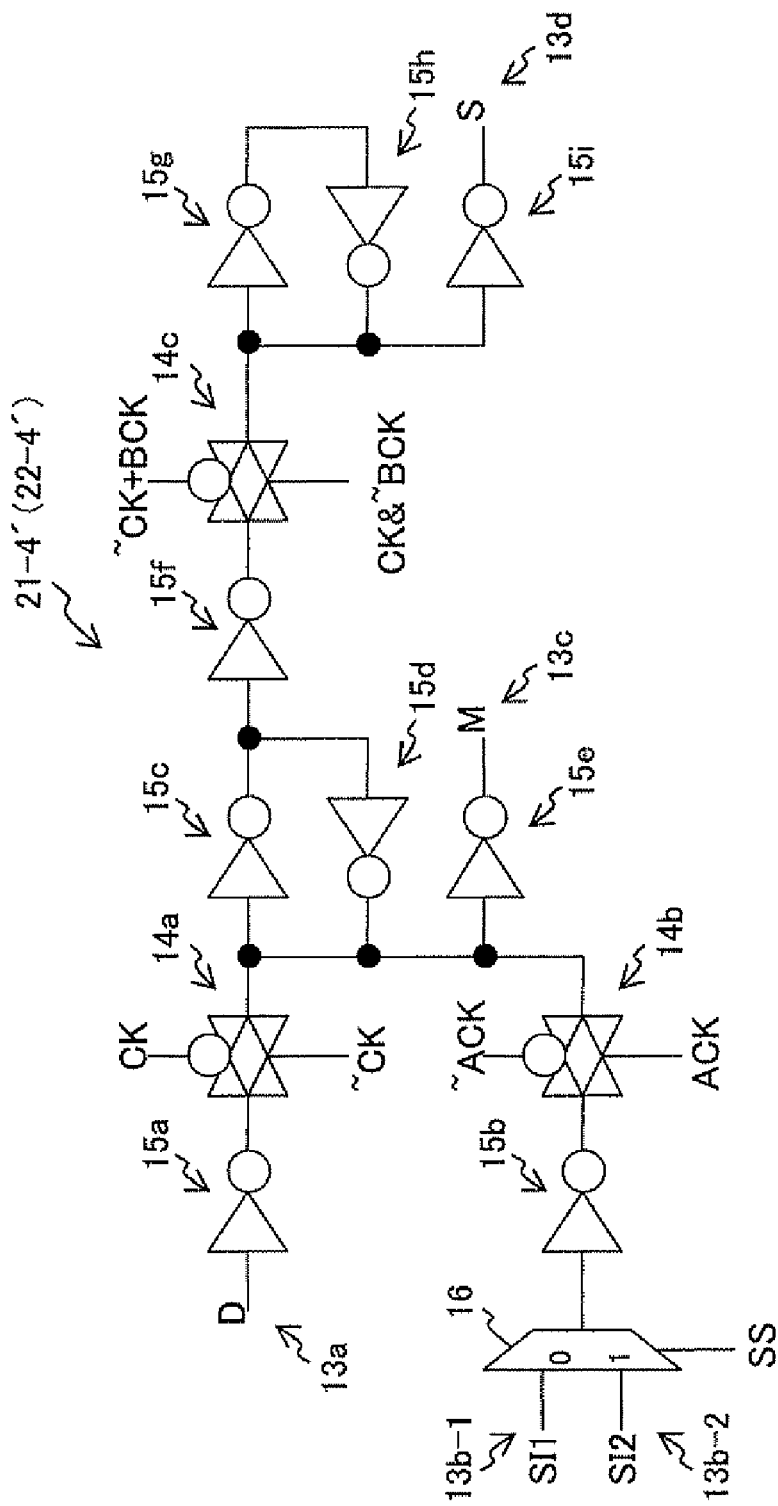
FIG. 12 is a diagram showing an example of structure of a flip-flop in the final stage of each of an inputting scan chain to be tested and a taking-out scan chain to be tested of the timing failure remedying apparatus for an integrated circuit according to the third embodiment of this invention.

As shown in FIG. 12, each of the flip-flops 21-4' and 22-4' has scan paths in two systems. Namely, each of the flip-flops 21-4' and 22-4' has two scan input terminals 13b-1 (denoted as "SI1" in the drawing) and 13b-2 (denoted as "SI2" in the drawing) instead of the scan input terminal 13b of the each of the flip-flops 21-4 and 22-4 of the first embodiment shown in FIG. 2, and a selecting circuit 16 for selecting either one of their outputs according to a selection signal (denoted as "SS" in the drawing). The scan operation is performed with the +ACK signal and the −BCK signal as is done in the flip-flop shown in FIG. 2, but the scan-inputs are switched according to the selection signal to form a plurality of scan paths.

Figure 13:
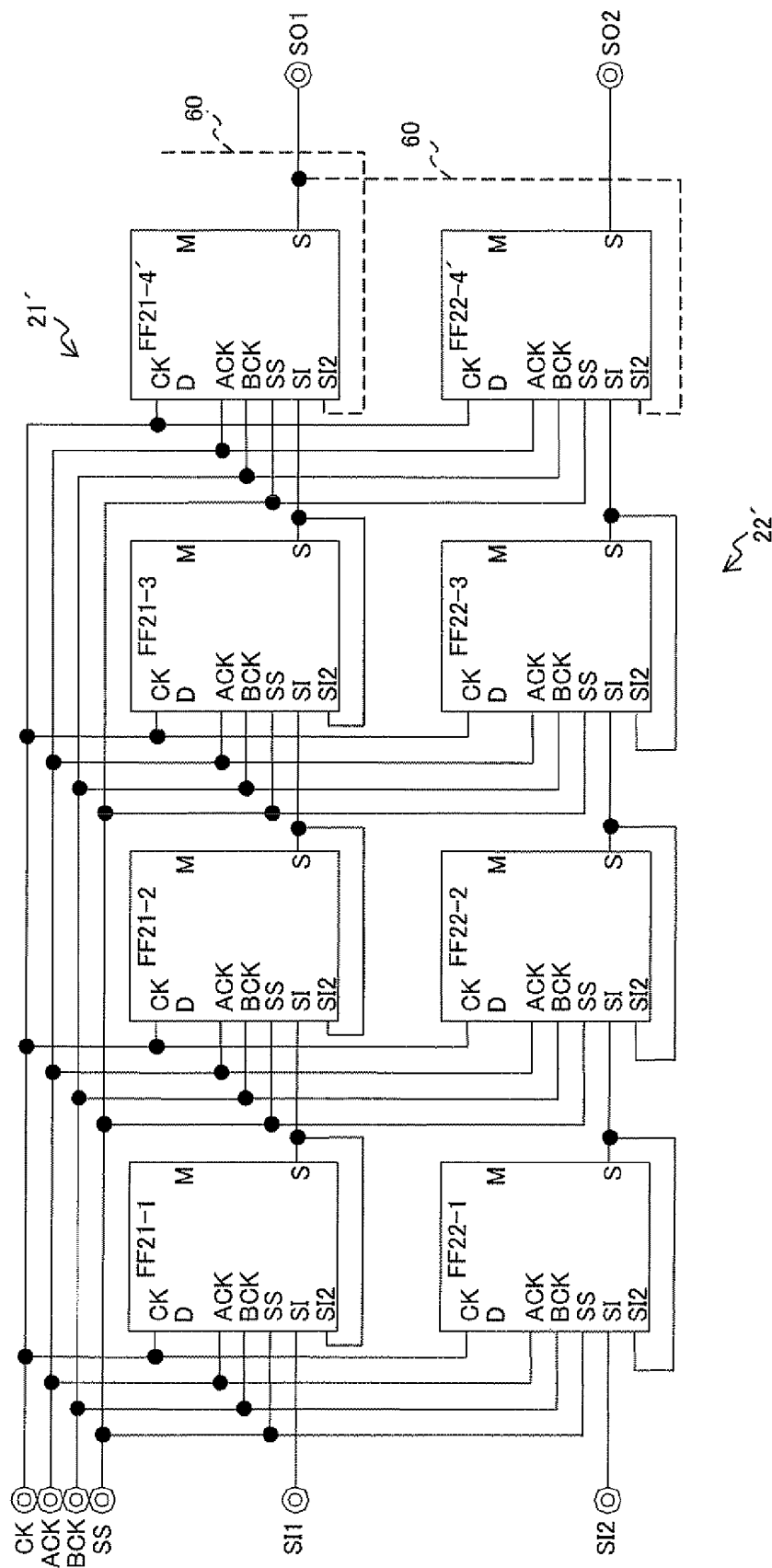
FIG. 13 is a diagram showing an example of structures of the inputting scan chain to be tested and the taking-out scan chain to be tested of the timing failure remedying apparatus for an integrated circuit according to the third embodiment of this invention.

FIG. 13 shows structures of the scan chains 21' and 22'' having the flip-flop 21-4' or 22-4', respectively. Incidentally, FIG. 13 shows a case where the same clock signals (CK, ACK, BCK and SS) is inputted to the scan chain 21' or 22' for the sake of simplicity.

As shown in FIG. 13, each of the scan chains 21' and 22' has scan chains in two systems, a scan chain for outputting data to the MISR 4, and a scan chain for outputting a value of the flip-flop 21-4' or 22-4' in the final stage to the outside (here, the diagnosing unit 54). The flip-flops (hereinafter, denoted as "FF") 21-1 through 21-3, 22-1 through 22-3 hold values when inputs from the scan-in input terminal 13b-2 (SI2) are used.

When the normal scan path for outputting data to the MISR 4 is used, in the scan chain 21', the signal (data) is propagated in the order of the input terminal SI1, the FF 21-1, the FF 21-2, FF 21-3, the FF 21-4' and the output terminal SO1. In the scan chain 22', the signal is propagated in the order of the input terminal SI2, the FF 22-1, the FF 22-2, the FF 22-3, the FF 22-4' and the output terminal SO2.

In the second scan path 60 used when a timing failure is pronounced by the diagnosing unit 54, the value is read out in the order of the FF 21-4', the FF 22-4' and the output terminal SO2.

In concrete, data held in the flip-flop 22-4' is outputted from the output terminal SO2 and data held in the flip-flop 21-4' is shifted to the flip-flop 22-4' by the first shift. By the next shift, data from the preceding stage (flip-flop 21-4') held in the flip-flop 22-4' is outputted from the output terminal SO2.

As above, the diagnosing unit 54 can read out a value held in the final stage of the taking-out scan chain 22' (21'). When pronouncing a diagnosis that a timing failure occurs in the integrated circuit 20a to be tested, the diagnosing unit 54 reads out a value held in the final stage of the taking-out scan chain 22' by using the scan path 60, and specifies a failure position (faulty flip-flop) at which the timing failure occurs in the taking-scan chain 22' on the basis of the read value.

The adjuster 56 adjusts at least either the cycle or the delay amount of the second clock signal to be applied to the faulty flip-flop specified by the diagnosing unit 54.

Figure 14:
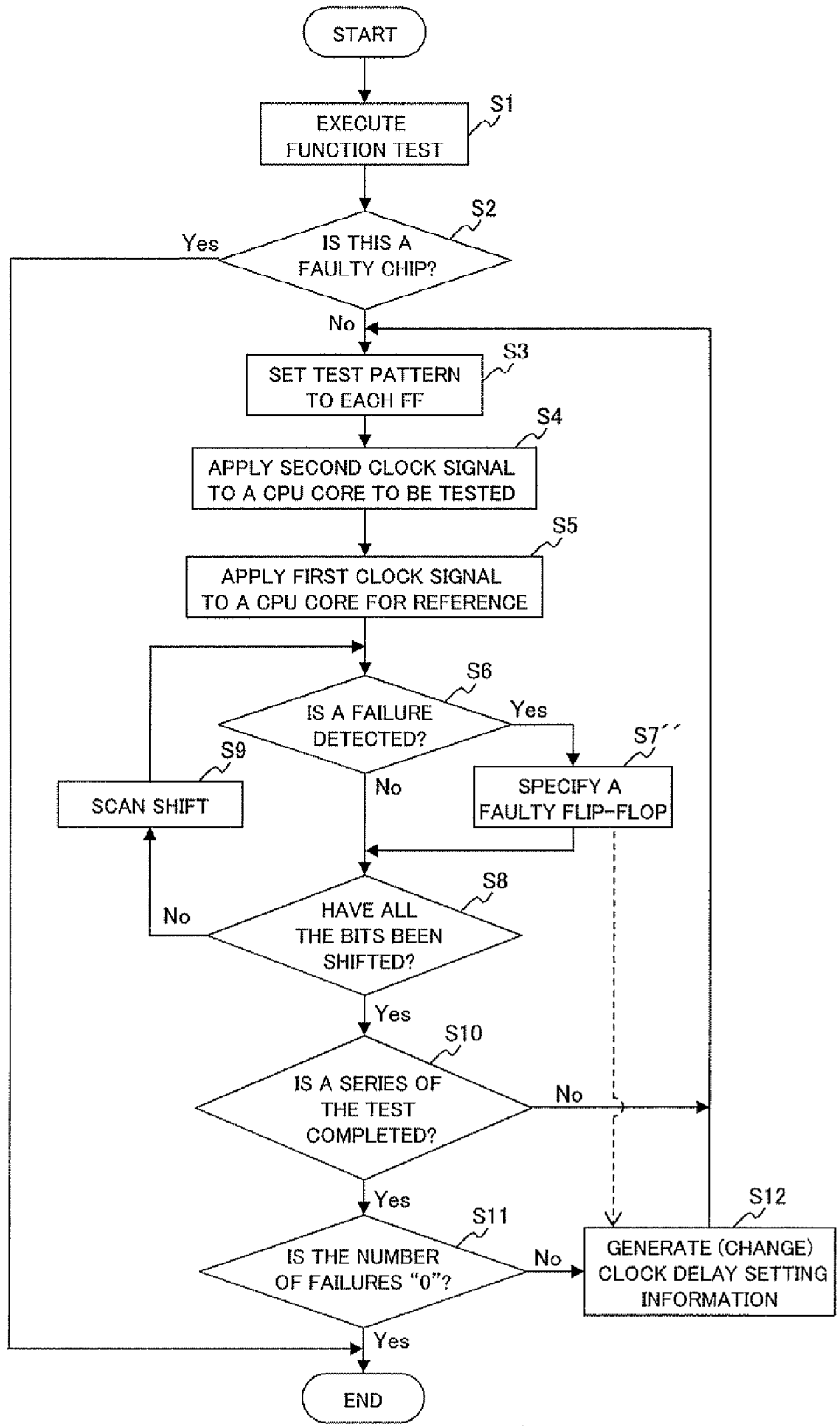
FIG. 14 is a flowchart for illustrating steps of a process according to a timing failure remedying method (timing failure diagnosing method) for an integrated circuit according to the third embodiment of this invention.

Next, description will be made of steps of an operation of the timing failure remedying apparatus 1c with reference to a flowchart (steps S1 through S6, S7" and S8 through S12) shown in FIG. 14. Incidentally, like reference characters in FIG. 14 designate like or corresponding parts, detailed descriptions of which are thus omitted here.

In the timing failure remedying apparatus 1c, when it is determined that a value obtained in the flip-flop 22-4' is different from a value obtained in the flip-flop 12-4 as a result comparison by the first comparator 51, or when it is determined that a value obtained in the flip-flop 21-4' is different from a value obtained in the flip-flop 11-4 as a result of comparison by the second comparator 53 (that is, a timing failure is detected; Yes route at step S6), a failure detection signal "1" is outputted from the OR gate 59. The diagnosing unit 54 directly reads out values in the flip-flops 21-4' and 22-4' by using the scan path 60 on the basis of the failure detection signal, and specifies a flip-flop 21-4' or 22-4' whose read out value differs from its expectation value as a faulty flip-flop (that is, specifies a failure position; step S7").

Specifying a faulty flip-flop at step S7" is carried out by the diagnosing unit 54 on the basis of the number of times the scan shift process (step S9) is performed. Information about the specified faulty flip-flop (failure position information) is retained in a memory area (not shown) in the diagnosing unit 54, for example, and used in the delay amount adjusting process by the adjuster 56 in the following step S12.

When the value in the flip-flop 22-4' (21-4') and the value in the flip-flop 12-4 (11-4) are identical (that is, no timing failure is detected; No route at step S6), the above process at step S7" is not carried out.

At step S12, the adjuster 56 adjusts the cycle and/or the delay amount (here, the delay amount setting information) of the second clock signal to be inputted to the faulty flip-flop on the bass of the information on the faulty flip-flip specified by the diagnosing unit 54 at the above step S7".

The integrated circuit 2 has the delay adjusting circuits 33-1, 33-2, 43-1 and 43-2 for the respective scan chains 11, 12, 21 and 22. Accordingly, when one faulty flip-flop is specified, the delay adjustment is performed on the entire scan chain involving the faulty flip-flop.

According to this invention, it is unnecessary to provide the delay adjusting circuits 33-1, 33-2, 43-1 and 43-2 for the respective scan chains 11, 12, 21 and 22 in the one-to-one fashion. Different delay adjusting circuits may be provided for flip-flops in the same scan chain, or the same delay adjusting circuit may charge of a plurality of flip-flops in difference scan chains. In such case, the diagnosing unit 54 specifies a faulty flip-flop, whereby the adjuster 56 adjusts the delay amount for a delay adjusting circuit in charge of the faulty flip-flop.

Figure 17:
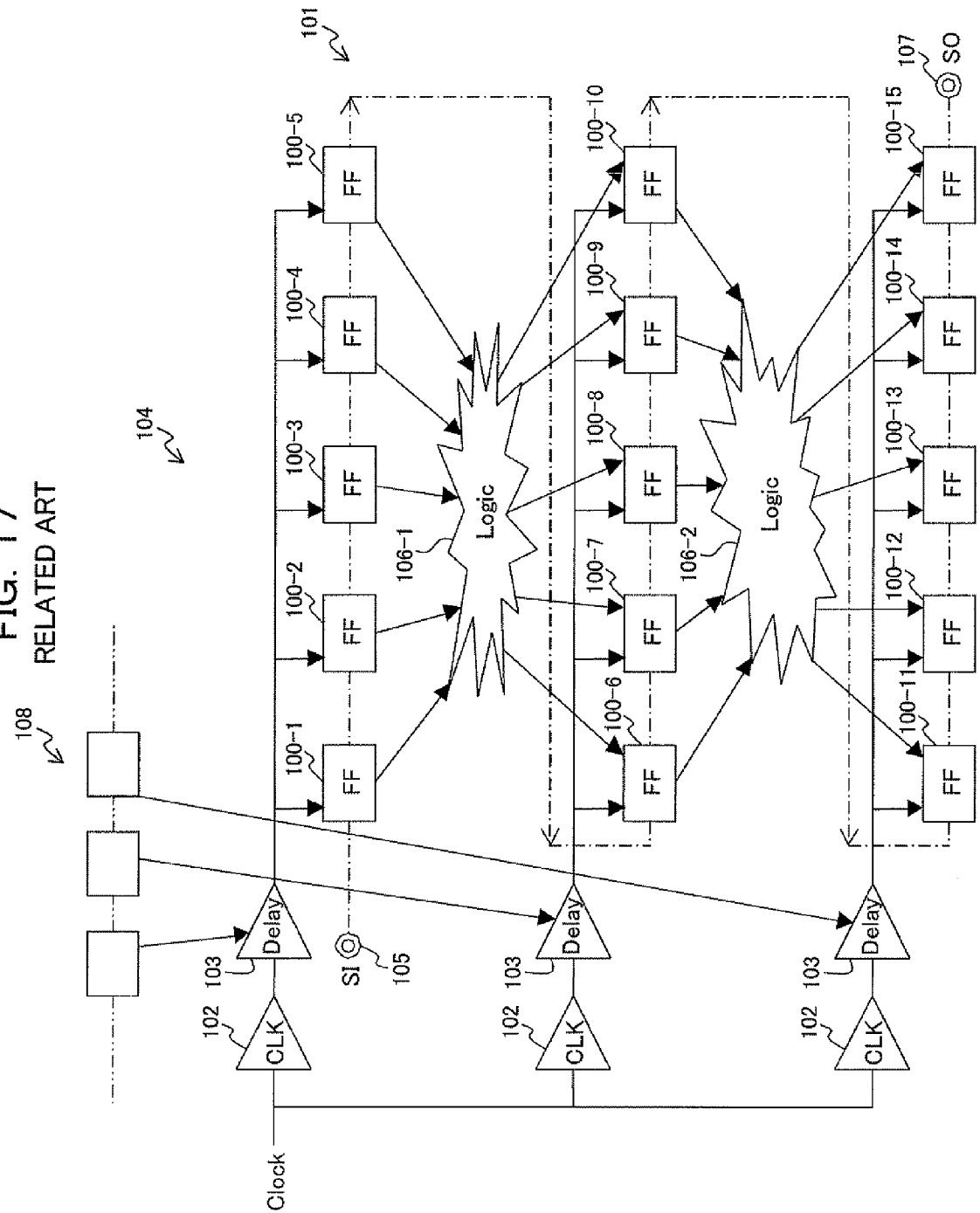
FIG. 17 is a diagram showing a structure of an integrated circuit on which known good/bad determination can be made.
Figure 18:
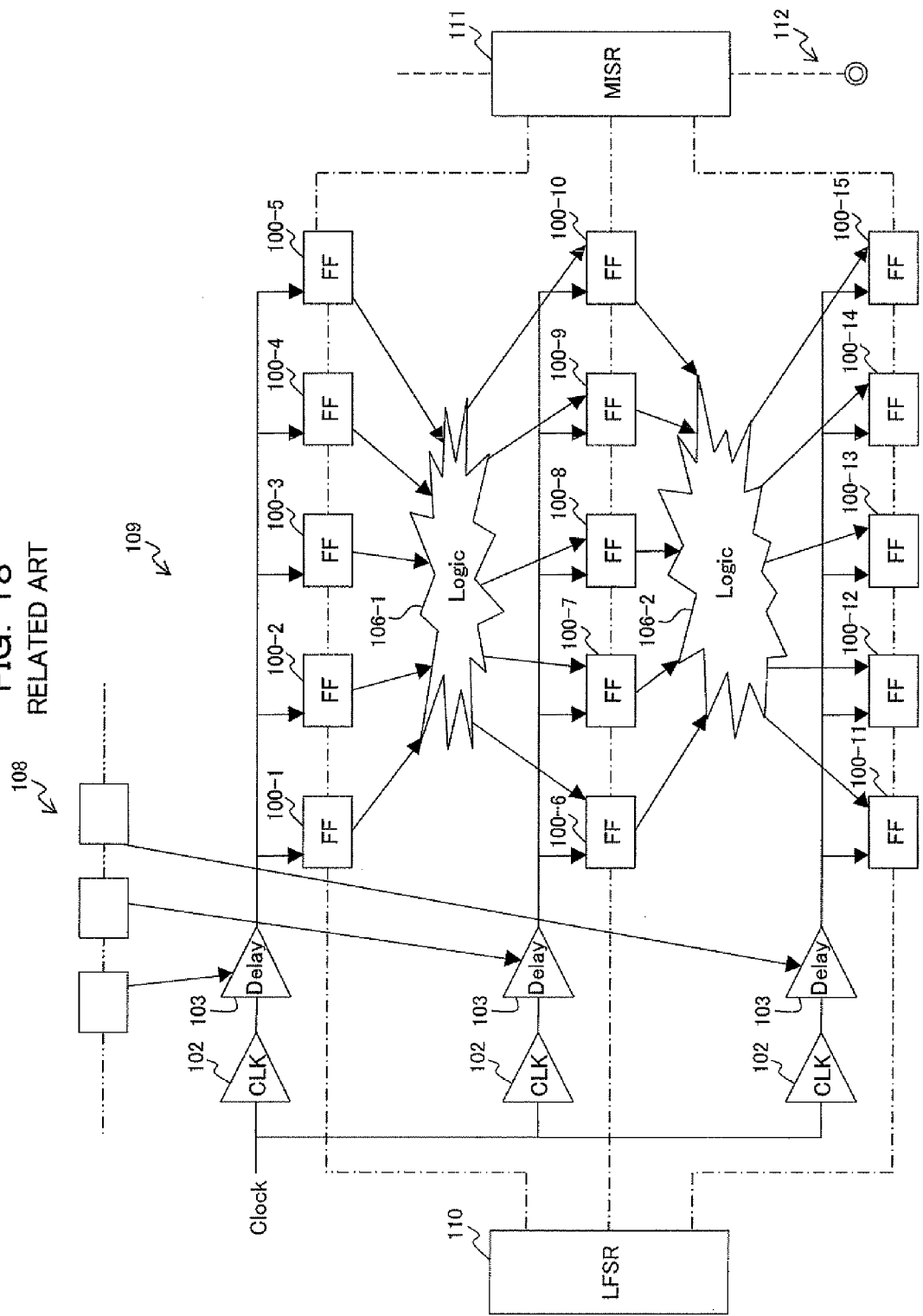
FIG. 18 is a diagram showing a structure of an integrated circuit having a known logic BIST mechanism.

In any case, the diagnosing unit 54 specifies a faulty flip-flop, whereby adjustment by the adjuster 56 can be executed, with certainty and efficiently. Incidentally, when the number of failures increases, the test-time-shortening advantage of the logic BIST is lessened. However, when a faulty flip-flop is specified, the number of bits to be read out can be more largely reduced than to read out all bits as prior art shown in FIG. 17, which allows the test time to be shortened more largely.

The timing failure remedying apparatus 1c for an integrated circuit according to the third embodiment can provide the same effects as those according to the first embodiment and the second embodiment described above.

[4] Others

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are intended to be embraced by the claims.

In the above embodiments, the CPU core 10 is used as a reference, whereas the CPU 20 is used as an examinee, for example. However, when the delay adjustment is completed on the CPU core 20, the timing failure remedying apparatuses 1a to 1c for an integrated circuit of this invention may store the setting value, then remedy a timing failure of the CPU 10 to be tested with the CPU core 20 used as the reference.

In the above embodiments, the integrated circuit 2 has the two CPU cores 10 and 20. However, this invention is not limited to this example. The timing failure remedying apparatuses 1a through 1c can perform the process on an integrated circuit having three or more CPU cores as does in the above embodiments. When the integrated circuit has three or more CPU cores, for example, the test (delay adjustment) may be made on a plurality of CPU cores with one CPU core used as a reference. Alternatively, the test (delay adjustment) may be made on one CPU core with one CPU core used as a reference, and the CPU to be test is changed in order.

In the above embodiments, the inputting mechanism (the clock signal inputting circuit and the delay adjusting circuit) of a clock signal is provided to each of the scan chains 11, 12, 21 and 22 in the integrated circuit 2. However, this invention is not limited to this example. The inputting mechanism for the clock signal may be provided to at least each of the CPU cores 10 and 20 to take charge of flip-flops in a plurality of scan chains of the same CPU core. In such case, the adjuster 56 can carry out, with certainty, adjustment of the second clock signal on the basis of a result of diagnosis by the diagnosing unit 54.

Figure 15:
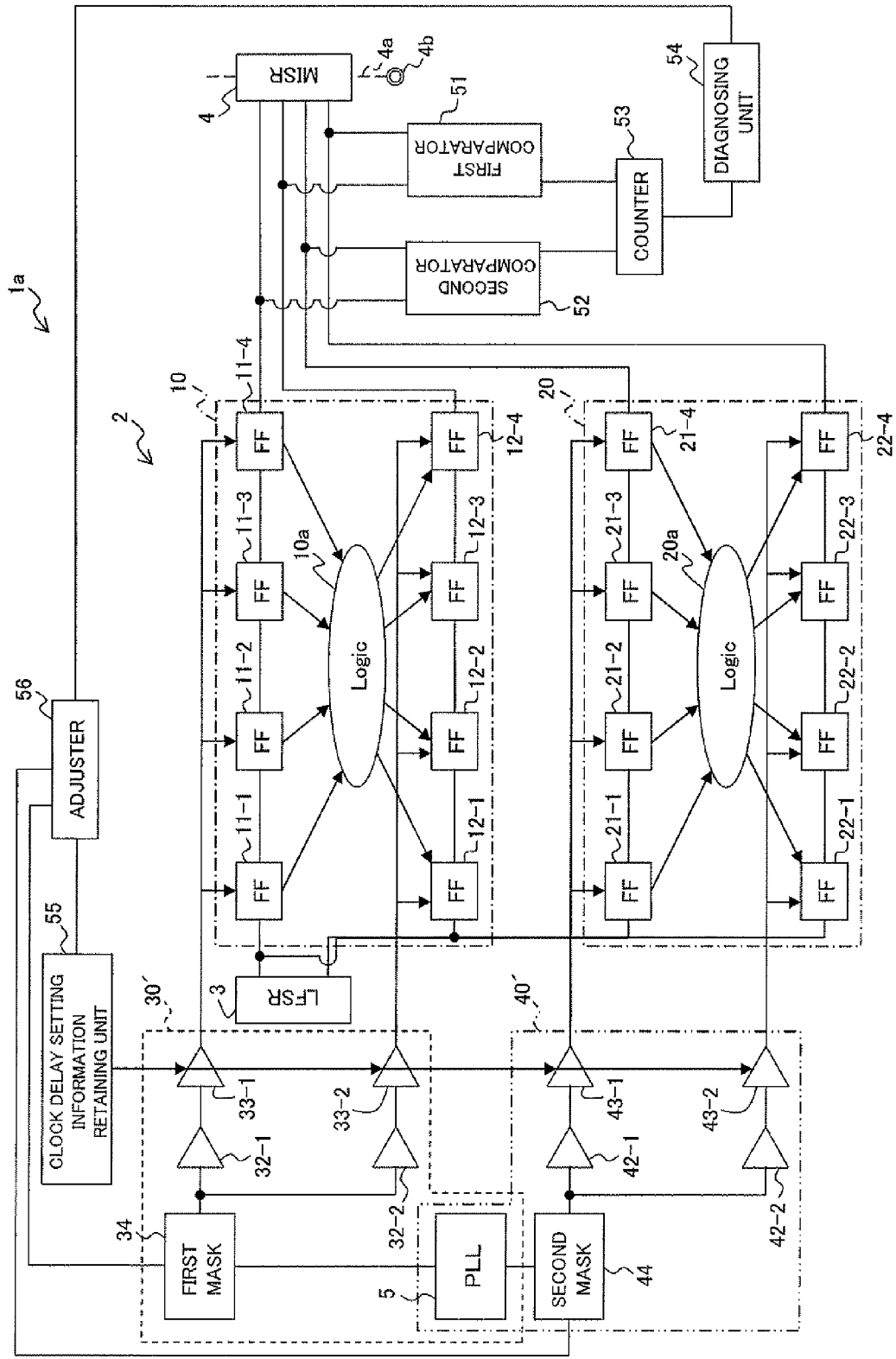
FIG. 15 is a diagram showing a structure of a timing failure remedying apparatus for an integrated circuit according to a modification of this invention.

In the above embodiments, each of the first clock signal applying unit 30 and the second clock signal applying unit 40 has the clock signal generating unit (the first clock signal generator 31, the second clock signal generator 41) generating the clock signal. However, the present invention is not limited to this example. As shown in FIG. 15, for example, a first clock signal applying unit 30' and a second clock signal applying unit 40' may share a PLL 5 inside the integrated circuit 2, and have a first mask 34 and a second mask 44, respectively, which mask a part of PLL clock generated by the PLL 5.

Figure 16:
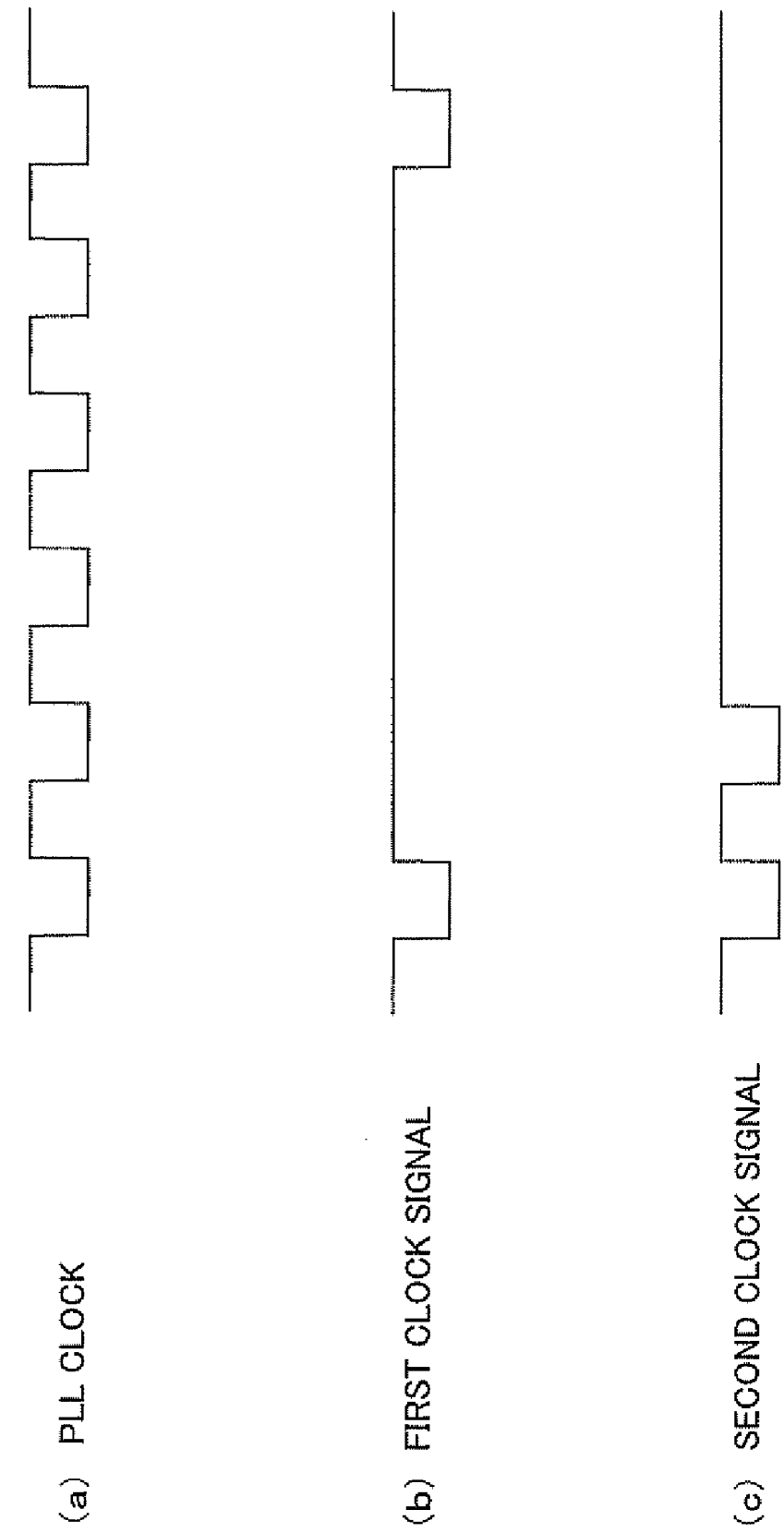
FIGS. 16(a) through 16(c) are diagrams for illustrating clock signals applied by a first clock signal applying unit and a second clock signal applying unit of the timing failure remedying apparatus for an integrated circuit according to the modification of this invention shown in FIG. 15; where

The first mask 34 in the first clock signal applying unit 30' masks a part of the PLL clock generated as shown in FIG. 16(*a*) to generate a first clock signal shown in FIG. 16(*b*), whereas the second mask 44 of the second clock applying unit 40' masks a part of the PLL clock to generate a second clock signal shown in FIG. 16(*c*).

The functions of the first comparator 51, the second comparator 52, the counter 53, the diagnosing unit 54 and the adjuster 56 may be realized by executing a predetermined application program (timing failure remedying program or timing failure diagnosing program for an integrated circuit) by a computer (including CPU, information processing apparatus, various terminals).

This program is provided in a form in which the program is recorded on a computer readable recording medium such as a flexible disk, a CD (CD-ROM, CD-R, CD-RW or the like), a DVD (DVD-ROM, DVD-RAM, DVD-R, DVD-RW, DVD+R, DVD+RW or the like) or the like. In this case, the computer reads the timing failure remedying program or timing failure diagnosing program for an integrated circuit from the recording medium, transfers the program to the internal storage or an external storage to store it, and uses the same. The program may be recorded on a storage (recording medium) such as a magnetic disk, an optical disk, a magneto-optical disk or the like, and provided to the computer from the storage over a communication line.

Here, the computer is a concept including hardware and an OS (Operating System), standing for hardware operating under control of the OS. When the OS is unnecessary and the application program solely operates the hardware, the hardware itself corresponds to the computer. The hardware has at least a microprocessor such as a CPU or the like, and a means for reading the computer program recorded on the recording medium.

The application program as being the above timing failure remedying program for an integrated circuit includes program codes for making the computer realize the functions of the first comparator 51, the second comparator 52, the counter 53, the diagnosing unit 54 and the adjuster 56. A part of these functions may be realized by not the application program but the OS.

The application program as being the above timing failure diagnosing program for an integrated circuit includes program codes for making the computer realize the functions of the first comparator 51, the second comparator 52, the counter 53 and the diagnosing unit 54. A part of these functions may be realized by not the application program but the OS.

As the recording medium in the embodiments of this invention, there may be used any one of various kinds of computer readable media such as an IC card, a ROM cartridge, a magnetic tape, a punched card, an internal storage (memory such as RAM, ROM or the like) of a computer, an external storage, a printed matter on which codes such as bar codes or the like are printed and so forth, other than a flexible disk, a CD, a DVD, a magnetic disk, an optical disk and a magneto-optical disk mentioned above.

What is claimed is:

1. A timing failure remedying apparatus for an integrated circuit having a plurality of logic circuits of the same logic, comprising:

a pattern generator for generating a test pattern to be inputted to each of said plural logic circuits;

a plurality of inputting scan chains for inputting the test pattern generated by said pattern generator to said plural logic circuits, respectively;

a plurality of taking-out scan chains for taking out values resulting from the test pattern from said plural logic circuits, respectively;

a first clock signal applying unit for applying a first clock signal in a first cycle to a processing core for reference having one of said plural logic circuits functioning for reference, one of said plural inputting scan chains (hereinafter referred to as an inputting scan chain for reference) corresponding to said logic circuit for reference and one of said plural taking-out scan chains (hereinafter referred to as a taking-out scan chain for reference) corresponding to said logic circuit for reference;

a second clock signal applying unit for applying a second clock signal in a second cycle differing from the first cycle to a processing core to be tested having another one of said plural logic circuits functioning to be tested, another one of said plural inputting scan chains (hereinafter referred to as an inputting scan chain to be tested) corresponding to said logic circuit to be tested and another one of said plural taking-out scan chains (hereinafter referred to as a taking-out scan chain to be tested) corresponding to said logic circuit to be tested;

a first comparator for comparing a value captured in said taking-out scan chain for reference from said logic circuit for reference through an operation of said processing core for reference according to the first clock signal applied by said first clock signal applying unit with a value captured in said taking-out scan chain to be tested from said logic circuit to be tested through an operation of said processing core to be tested according to the second clock signal applied by said second clock signal applying unit;

a diagnosing unit for diagnosing a timing failure in said logic circuit to be tested on the basis of a result of comparison made by said first comparator; and an adjuster for, when said diagnosing unit pronounces a diagnosis that a timing failure occurs, adjusting at least either the second cycle or a delay amount of the second clock signal to be applied to said processing core to be tested by said second clock signal applying unit to remedy the timing failure.

2. The timing failure remedying apparatus for an integrated circuit according to claim 1 further comprising:
a compressing/storing unit for compressing values taking out from said logic circuits and outputted from said plural taking-out scan chains as signatures, and storing the same.

3. The timing failure remedying apparatus for an integrated circuit according to claim 1, wherein the second cycle of the second clock signal applied by said second clock signal applying unit is shorter than the first cycle of the first clock signal.

4. The timing failure remedying apparatus for an integrated circuit according to claim 1 further comprising:
a delay amount setting information retaining unit for retaining delay amount setting information for setting the delay amount of the second clock signal applied to said processing core to be tested by said second clock signal applying unit;
wherein said adjuster changes the delay amount setting information retained in said delay amount setting information retaining unit.

5. The timing failure remedying apparatus for an integrated circuit according to claim 1, wherein said second clock signal applying unit can change the second cycle of the second clock signal; and
said adjuster changes the second cycle of the second clock signal applied by said second clock signal applying unit.

6. The timing failure remedying apparatus for an integrated circuit according to claim 1, wherein, when said first comparator determines as a result of comparison that the value captured in said taking-out scan chain for reference differs from the value captured in said taking-out scan chain to be tested, said diagnosing unit pronounces a diagnosis that a timing failure occurs in said logic circuit to be tested.

7. The timing failure remedying apparatus for an integrated circuit according to claim 1 further comprising:
a second comparator for comparing a value held in said inputting scan chain for reference after an operation of said processing core for reference according to the first clock signal applied by said first clock signal applying unit with a value held in said inputting scan chain to be tested after an operation of said processing core to be tested according to the second clock signal applied by said second clock signal applying unit;
wherein said diagnosing unit diagnoses a timing failure in said logic circuit to be tested on the basis of results of comparison made by said first comparator and said second comparator.

8. The timing failure remedying apparatus for an integrated circuit according to claim 1 further comprising:
a counter for counting results of comparison made by said first comparator;
wherein said diagnosing unit diagnoses the number of timing failures occurring in said logic circuit to be tested on the basis of a value of said counter.

9. The timing failure remedying apparatus for an integrated circuit according to claim 8 still further comprising:
a second comparator for comparing a value held in said inputting scan chain for reference after an operation of said processing core for reference according to the first clock signal applied by said first clock signal applying unit with a value held in said inputting scan chain to be tested after an operation of said processing core to be tested according to the second clock signal applied by said second clock signal applying unit;
wherein said counter counts results of comparison made by said first comparator and said second comparator.

10. The timing failure remedying apparatus for an integrated circuit according to claim 8, wherein said adjuster adjusts at least either the second cycle or the delay amount of the second clock signal so that the value of said counter is decreased.

11. The timing failure remedying apparatus for an integrated circuit according to claim 1 further comprising:
a first retaining unit for retaining a result of comparison made by said first comparator;
wherein said diagnosing unit specifies a faulty scan chain in which the timing failure occurs on the basis of the result of comparison retained in said first retaining unit.

12. The timing failure remedying apparatus for an integrated circuit according to claim 11 still further comprising:
a second comparator for comparing a value held in said inputting scan chain for reference after an operation of said processing core for reference according to the first clock signal applied by said first clock signal applying unit with a value held in said inputting scan chain to be tested after an operation of said processing core to be tested according to the second clock signal applied by said second clock signal applying unit; and
a second retaining unit for retaining a result of comparison made by said second comparator;
wherein said diagnosing unit specifies the faulty scan chain on the basis of the results of comparison retained in said first retaining unit and said second retaining unit.

13. The timing failure remedying apparatus for an integrated circuit according to claim 11, wherein said adjuster adjusts at least either the second cycle or the delay amount of the second clock signal to be applied to the faulty scan chain specified by said diagnosing unit.

14. The timing failure remedying apparatus for an integrated circuit according to claim 1, wherein said diagnosing unit can read a value held in the final stage of said taking-out scan chain to be tested; and
said diagnosing unit reads the value retained in the final stage of said taking-out scan chain to be tested when pronounces a diagnosis that a timing failure occurs in said logic circuit to be tested, and specifies a failure position at which the timing failure occurs in said taking-out scan chain to be tested on the basis of the read value.

15. The timing failure remedying apparatus for an integrated circuit according to claim 14 further comprising:
a second comparator for comparing a value held in said inputting scan chain for reference after an operation of said processing core for reference according to the first clock signal applied by said first clock signal applying unit with a value held in said inputting scan chain to be tested after an operation of said processing core to be tested according to the second clock signal applied by said second clock signal applying unit;
wherein said diagnosing unit diagnoses a timing failure in said logic circuit to be tested on the basis of results of comparison made by said first comparator and said second comparator, and can read a value held in the final stage of said inputting scan chain to be tested; and
said diagnosing unit reads values held in the final stage of said taking-out scan chain to be tested and the final stage of said inputting scan chain to be tested when pronounces a diagnosis that the timing failure occurs in said logic circuit to be tested, and specifies a failure position at which the timing failure occurs on the basis of the read values.

16. The timing failure remedying apparatus for an integrated circuit according to claim 14, wherein said adjuster adjusts at least either the second cycle or the delay amount of the second clock signal to be applied to the failure position specified by said diagnosing unit.

17. A timing failure remedying apparatus for an integrated circuit having a plurality of logic circuits of same logic, comprising:
a pattern generator for generating a test pattern to be inputted to each of said plural logic circuits;
a plurality of inputting scan chains for inputting the test pattern generated by said pattern generator to said plural logic circuits, respectively;
a plurality of taking-out scan chains for taking out values resulting from the test pattern from said plural logic circuits, respectively;
a first clock signal applying unit for applying a first clock signal in a first cycle to a processing core for reference having one of said plural logic circuits functioning for reference, one of said plural inputting scan chains corresponding to said logic circuit for reference and one of said plural taking-out scan chains (hereinafter referred to as a taking-out scan chain for reference) corresponding to said logic circuit for reference;
a second clock signal applying unit for applying a second clock signal in a second cycle differing from the first cycle to a processing core to be tested having another one of said plural logic circuits functioning to be tested, another one of said plural inputting scan chains corresponding to said logic circuit to be tested and another one of said plural taking-out scan chains (hereinafter referred to as a taking-out scan chain to be tested) corresponding to said logic circuit to be tested;
a comparator for comparing a value captured in said taking-out scan chain for reference from said logic circuit for reference through an operation of said processing core for reference according to the first clock signal applied by said first clock signal applying unit with a value captured in said taking-out scan chain to be tested from said logic circuit to be tested through an operation of said processing core to be tested according to the second clock signal applied by said second clock signal applying unit; and a diagnosing unit for diagnosing a timing failure in said logic circuit to be tested on the basis of a result of comparison made by said comparator.

18. A timing failure diagnosing method for an integrated circuit having a plurality of processing cores, each of which has a logic circuit, an inputting scan chain for inputting a test pattern to said logic circuit, and a taking-out scan chain for taking out values resulting from the test pattern from said logic circuit, said logic circuits of said plural processing cores being of the same logic, comprising the steps of:
inputting the same test pattern to said logic circuits of said plural processing cores through said inputting scan chains;
applying a first clock signal in a first cycle to one of said plural processing cores functioning for reference;
applying a second clock signal in a second cycle differing from the first cycle to another one of said plural processing cores functioning to be tested;
comparing a value captured in a corresponding one of said taking-out scan chains from said logic circuit of said processing core for reference through an operation of said processing core for reference according to the first clock signal with a value captured in a corresponding one of said taking-out scan chains from said logic circuit of said processing core to be tested through an operation of said processing core to be tested according to the second clock signal; and
diagnosing a timing failure in said logic circuit of said processing core to be tested on the basis of a result of the comparison.

19. An integrated circuit comprising:
a plurality of logic circuits of the same logic;
a pattern generator for generating a test pattern to be inputted to each of said plural logic circuits;
a plurality of inputting scan chains for inputting the test pattern generated by said pattern generator to said plural logic circuits, respectively;
a plurality of taking-out scan chains for taking out values resulting from the test pattern from said plural logic circuits, respectively;
a first clock signal applying unit for applying a first clock signal in a first cycle to a processing core for reference having one of said plural logic circuits functioning for reference, one of said plural inputting scan chains corresponding to said logic circuit for reference and one of said plural taking-out scan chains (hereinafter referred to as a taking-out scan chain for reference) corresponding to said logic circuit for reference;
a second clock signal applying unit for applying a second clock signal in a second cycle differing from the first cycle to a processing core to be tested having another one of said plural logic circuits functioning to be tested, another one of said plural inputting scan chains corresponding to said logic circuit to be tested and another one of said plural taking-out scan chains (hereinafter referred to as a taking-out scan chain to be tested) corresponding to said logic circuit to be tested; and
a comparator for comparing a value captured in said taking-out scan chain for reference from said logic circuit for reference through an operation of said processing core for reference according to the first clock signal applied by said first clock signal applying unit with a value captured in said taking-out scan chain to be tested from said logic circuit to be tested through an operation of said processing core to be tested according to the second clock signal applied by said second clock signal applying unit.

20. The integrated circuit according to claim 19 further comprising:

a diagnosing unit for diagnosing a timing failure in said logic circuit to be tested on the basis of a result of comparison made by said comparator; and an adjuster for adjusting at least either the second cycle or a delay amount of the second clock signal to be applied to said processing core to be tested by said second clock signal applying unit in order to remedy the timing failure when said diagnosing unit pronounces a diagnosis that the timing failure occurs.

21. A computer readable recording medium recorded thereon a timing failure remedying program for an integrated circuit which makes a computer realize a function of remedying a timing failure in an integrated circuit, said integrated circuit having a plurality of logic circuits of the same logic; a plurality of inputting scan chains for inputting a test pattern to said plural logic circuits, respectively; a plurality of taking-out scan chains for taking out values resulting from the test pattern from said plural logic circuits, respectively; a first clock signal applying unit for applying a first clock signal in a first cycle to a processing core for reference having one of said plural logic circuits functioning for reference, one of said plural inputting scan chains corresponding to said logic circuit for reference and one of said plural taking-out scan chains (hereinafter referred to as a taking-out scan chain for reference) corresponding to said logic circuit for reference; and a second clock signal applying unit for applying a second clock signal in a second cycle differing from the first cycle to a processing core to be tested having another one of said plural logic circuits functioning to be tested, another one of said plural inputting scan chains corresponding to said logic circuit to be tested and another one of said plural taking-out scan chains (hereinafter referred to as a taking-out scan chain to be tested) corresponding to said logic circuit to be tested;

the timing failure remedying program for an integrated circuit making the computer function as a comparator for comparing a value captured in said taking-out scan chain for reference from said logic circuit for reference through an operation of said processing core for reference according to the first clock signal applied by said first clock signal applying unit with a value captured in said taking-out scan chain to be tested from said logic circuit to be tested through an operation of said processing core to be tested according to the second clock signal applied by said second clock signal applying unit;

a diagnosing unit for diagnosing a timing failure in said logic circuit to be tested on the basis of a result of comparison made by said comparator; and an adjuster for adjusting at least either the second cycle or a delay amount of the second clock signal to be applied to said processing core to be tested by said clock signal applying unit in order to remedy the timing failure when said diagnosing unit pronounces a diagnosis that the timing failure occurs.

22. A computer readable recording medium recorded thereon a timing failure remedying program for an integrated circuit which makes a computer realize a function of remedying a timing failure in an integrated circuit, said integrated circuit having a plurality of logic circuits of the same logic; a plurality of inputting scan chains for inputting a test pattern to said plural logic circuits, respectively; a plurality of taking-out scan chains for taking out values resulting from the test pattern from said plural logic circuits, respectively; a first clock signal applying unit for applying a first clock signal in a first cycle to a processing core for reference having one of said plural logic circuits functioning for reference, one of said plural inputting scan chains corresponding to said logic circuit for reference and one of said plural taking-out scan chains (hereinafter referred to as a taking-out scan chain for reference) corresponding to said logic circuit for reference; and a second clock signal applying unit for applying a second clock signal in a second cycle differing from the first cycle to a processing core to be tested having another one of said plural logic circuits functioning to be tested, another one of said plural inputting scan chains corresponding to said logic circuit to be tested and another one of said plural taking-out scan chains (hereinafter referred to as a taking-out scan chain to be tested) corresponding to said logic circuit to be tested;

the timing failure remedying program for an integrated circuit making the computer function as a comparator for comparing a value captured in said taking-out scan chain for reference from said logic circuit for reference through an operation of said processing core for reference according to the first clock signal applied by said first clock signal applying unit with a value captured in said taking-out scan chain to be tested from said logic circuit to be tested through an operation of said processing core to be tested according to the second clock signal applied by said second clock signal applying unit; and a diagnosing unit for diagnosing a timing failure in said logic circuit to be tested on the basis of a result of comparison made by said comparator.

* * * * *